US012769364B2

(12) United States Patent
Chang

(10) Patent No.: US 12,769,364 B2
(45) Date of Patent: Oct. 20, 2026

(54) INFORMATION HANDLING SYSTEM BATTERY CONNECTOR WITH VERTICAL AND HORIZONTAL CONNECTIONS

(71) Applicant: Dell Products L.P., Round Rock, TX (US)

(72) Inventor: Chia-Fa Chang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 18 days.

(21) Appl. No.: 18/754,678

(22) Filed: Jun. 26, 2024

(65) Prior Publication Data

US 2026/0003397 A1 Jan. 1, 2026

(51) Int. Cl.
*G06F 1/16* (2006.01)
*H05K 7/14* (2006.01)

(52) U.S. Cl.
CPC .......... *G06F 1/1635* (2013.01); *G06F 1/1616* (2013.01); *H05K 7/1402* (2013.01)

(58) Field of Classification Search
CPC ..... H01R 12/722; H01R 13/71; G06F 1/1635; G06F 1/1616
USPC .......................................... 439/682, 500, 65
See application file for complete search history.

(56) References Cited

U.S. PATENT DOCUMENTS

| | | | | |
|---|---|---|---|---|
| 7,121,848 | B2 * | 10/2006 | Ono | H01R 12/57 439/682 |
| 7,677,919 | B1 * | 3/2010 | Lin | H01R 13/113 439/682 |
| 8,092,236 | B2 * | 1/2012 | Yang | H01R 12/707 439/82 |
| 8,608,504 | B2 * | 12/2013 | Tseng | H01R 13/6471 439/497 |
| 8,727,813 | B2 * | 5/2014 | Yang | H01R 12/732 439/682 |
| 11,563,289 | B2 * | 1/2023 | Chen | H01R 27/00 |
| 11,592,883 | B2 * | 2/2023 | Shih | G06F 1/1662 |
| 12,166,314 | B2 * | 12/2024 | Chang | H01R 13/71 |
| 2021/0232234 | A1 * | 7/2021 | Morrison | G06F 1/1681 |
| 2022/0361266 | A1 * | 11/2022 | Ahmed | G06F 1/1616 |
| 2023/0029463 | A1 | 2/2023 | Chang et al. | |

* cited by examiner

*Primary Examiner* — Hae Moon Hyeon
(74) *Attorney, Agent, or Firm* — ZAGORIN CAVE LLP; Robert W. Holland

(57) ABSTRACT

An information handling system battery interfaces with a motherboard through a connector and receptacle that contribute to a standardized coupling arrangement while accommodating a wide variety of footprints and component configurations. The connector terminates to pin terminals that mount to a circuit board and gap terminals that accept a wire to accommodate different coupling arrangements. The connector conductive elements slide horizontally into receptacle conductive members or alternatively press down for a vertical coupling. A battery receptacle accepts the connector with a horizontal sliding insertion or a vertical press insertion.

10 Claims, 39 Drawing Sheets

| DIMENSIONS | | 3-5-3 | | | 4-5-4 | | |
|---|---|---|---|---|---|---|---|
| | | W | L | H | W | L | H |
| A2. RECPT | | 22.6 | 8.0 | **2.2** | 25.0 | 8.0 | **2.2** |
| HORIZONTAL | B WIRE<br>C FPC | 19.1 | 7.7 | 2.15 | 21.5 | 7.7 | 2.15 |
| VERTICAL | D WIRE<br>E FPC | 19.5 | 8.0 | 2.15 | 21.9 | 8.0 | 2.15 |

FIG. 3J

| PIN # | | SIGNAL | DESCRIPTION/FUNCTION |
|---|---|---|---|
| 1 | | BATT1+ | POWER, BATT+, POSITIVE TERMINAL OF BATTERY PACK |
| 2 | | BATT2+ | POWER, BATT+, POSITIVE TERMINAL OF BATTERY PACK |
| 3 | | BATT3+ | POWER, BATT+, POSITIVE TERMINAL OF BATTERY PACK |
| 4 | | CLK_SMB | SYSTEM MANAGEMENT BUS CLOCK |
| 5 | | DAT_SMB | SYSTEM MANAGEMENT BUS DATA |
| 6 | | BATT_PRS* | BATTERY PRESENT (THIS IS TIED TO LDO PIN OF SECOND PROTECTOR IC) |
| 7 | | SYS_PRES* | SYSTEM PRESENT (THIS IS TIED TO GROUND ON THE SYSTEM SIDE) |
| 8 | | NC | |
| 9 | | GND1 | POWER, BATT-, NEGATIVE TERMINAL OF BATTERY PACK |
| 10 | | GND2 | POWER, BATT-, NEGATIVE TERMINAL OF BATTERY PACK |
| 11 | | GND3 | POWER, BATT-, NEGATIVE TERMINAL OF BATTERY PACK |

FIG. 4

INFORMATION HANDLING SYSTEM BATTERY CONNECTOR WITH VERTICAL AND HORIZONTAL CONNECTIONS

BACKGROUND OF THE INVENTION

Field of the Invention

The present invention relates in general to the field of portable information handling systems, and more particularly to an information handling system battery connector with vertical and horizontal connections.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Portable information handling systems come in a wide variety of sizes and capabilities. Typically, the width and length of a portable information handling system are driven by the size of the display integrated in the housing. The height of the portable housing generally has to provide sufficient space to contain the processing components that cooperate to process information and to offer adequate thermal rejection of excess thermal energy generated by dissipation of power through the processing components. For any particular system, the internal space tends to increase with the capabilities of the processing components, especially where a cooling fan is included to encourage thermal dissipation with a cooling airflow. All of these power-consuming components are taken into consideration when a battery is selected for the portable information handling system. The battery has to support operation of the information handling system on internal power only for a defined amount of time and also fit within the small volume provided by the portable housing.

In many instances, the internal volume available for the battery can have odds sizes and shapes as well as different locations relative to the physical connection of the battery to the system motherboard. As a result, an information handling system manufacturer may have many SKU codes for different types of batteries with different amounts of power storage, physical dimensions and motherboard connectors. Additional SKU (Stock Keeping Units) codes can become necessary for cables that interfaces the batteries to the motherboard. Large numbers of battery, connector and cable types increase inventory and manufacturing expense. In addition, system maintenance and repair faces greater complexity where an end user has to interact with the battery during repairs or when the housing is open. An inadvertent touch during battery removal or assembly can result in a discharge that can damage the system. Although an end user can power off the system before opening the housing, in some instances the system can get stuck in a powered up state, such as when the BIOS (Basic Input/Output System) and/or embedded controller are hung or otherwise frozen so that system power management logic is not available.

SUMMARY OF THE INVENTION

Therefore, a need has arisen for a system and method which standardizes battery connections across multiple system platforms.

In accordance with the present invention, a system and method are provided which substantially reduce the disadvantages and problems associated with previous methods and systems for interfacing a battery with an information handling system. A battery receptacle coupled to an information handling system motherboard accepts a battery connector horizontally slid and vertically pressed into position. The battery connector optionally includes a switch that selectively enables and disables communication so that power transfer between the battery and motherboard is selectively enabled and disabled.

More specifically, an information handling system processes information with a processor that executes instructions in cooperation with a memory and communicating through a motherboard coupled in a portable housing. A battery coupled in the portable housing stores power for use by the processing components and communicates the power through a battery connector inserted in a battery receptacle that couples to the motherboard. In one embodiment the battery connector includes a switch that selectively enables and disables communication through an SMBus (Systems Management Bus) to enable and disable power transfer while the connector power and ground pins remain interfaced. In another embodiment, the battery connector completes detection circuit between conductive endpieces of the battery receptacle so that the embedded controller initiates a hard reset at battery connection and/or disconnection. The battery connector is configured to couple to individual wires or a printed circuit board both with and without a switch so that the same connector components reuse in slightly varied formats to fit in the same battery receptacle. In one embodiment, the battery connector can slide horizontally or press down vertically to couple to the battery receptacle thereby offering flexibility in connector use with different types of receptable footprints.

The present invention provides a number of important technical advantages. One example of an important technical advantage is that an information handling system battery couples to a motherboard through a standard connector and receptacle having flexible placement and fitting in a minimal footprint. A switch located on the battery connector enables and disables power transfer so that an end user can power down the system before connecting and disconnecting the battery. A battery detection circuit triggered by the physical placement of the battery connector in the battery receptacle initiates a hard reset with a change in the battery connections state to avoid a system hang in the BIOS or embedded controller.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A, 3B, 3C, 3D, 3E, 3F, 3G, 3H, 3I, and 3J depict examples of different types of battery connector and battery receptacle configurations;

FIG. 4 depicts a table having an example pin configuration of a 3-5-3 battery connector and battery receptacle;

DETAILED DESCRIPTION

An information handling system battery connector and receptacle adapt to a variety of environments for simplified manufacture, use and serviceability. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM (read-only memory), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
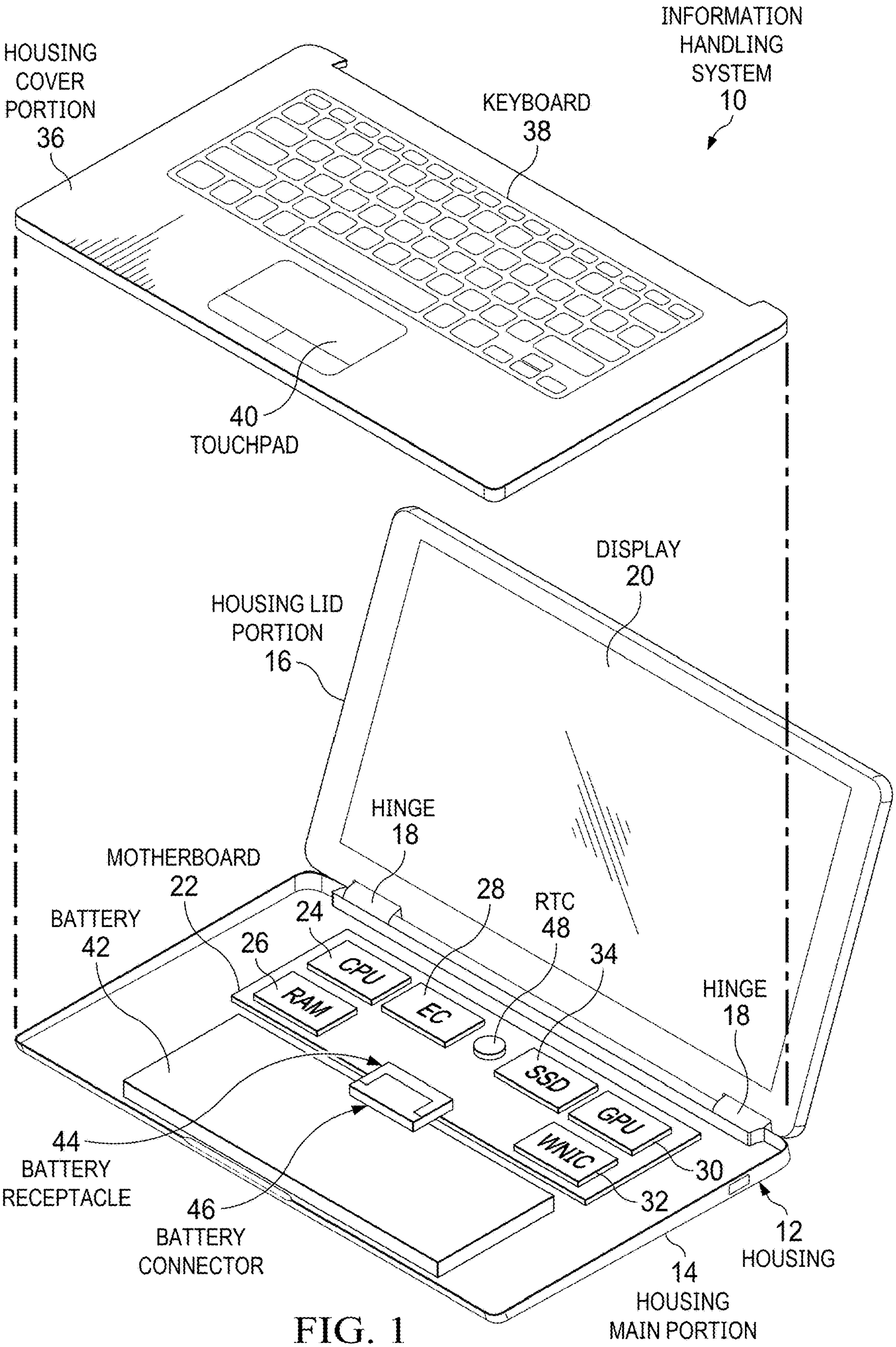
FIG. 1 depicts a top view of an information handling system having a battery that couples in a housing main portion with battery power and communication supported through a battery connector inserted into a battery receptacle.

Referring now to FIG. 1, a top view of an information handling system 10 depicts a battery 42 that couples in a housing main portion 14 with battery power and communication supported through a battery connector 46 inserted into a battery receptacle 44. In the example embodiment, information handling system 10 has a portable configuration built into a portable housing 12 having a main portion 14 rotationally coupled to a lid portion 16 by a hinge 18 to rotate between open and closed positions. Alternative embodiments may have tablet or other types of housing configurations. A display 20 couples in housing lid portion 16 to present information has visual images. Information is processed with processing components coupled in housing main portion 14 and interfacing through a motherboard 22. A central processing unit (CPU) 24 executes instructions that process information in cooperation with a random access memory (RAM) 26 that stores the instructions and information. An embedded controller 28 includes flash memory and executes instructions that manage physical operation of system components, such as application of power, management of thermal constraints and interactions with input/output devices. A graphics processing unit (GPU) 30 further processes information to generate visual images, such as by defining pixel values for display 20. A wireless network interface controller (WNIC) 32 provides communication with external devices, such as through WIFI and BLUETOOTH. A solid state drive (SSD) 34 provides persistent storage of information, such as with non-transitory flash memory. As an example, SSD 34 stores an operating system and applications in a power down state that are retrieved by embedded controller 28 preboot instructions at power up to bring the information handling system to an operational state. A Basic Input/Output System (BIOS) stored in SSD 34 and/or embedded controller 28 flash executes to manage interactions between physical devices. A housing cover portion 36 couples over main portion 14 to protect the processing components and to offer a support for integrated inputs devices like keyboard 38 and touchpad 40 that accept end user inputs.

To operate the processing components, embedded controller 28 applies power from a power supply that includes external power, such as from a power supply interfaced with an outlet, and internal power available from a battery 42, such as a lithium ion battery. Embedded controller 28 manages battery charge and discharge in cooperation with other components of motherboard 22, such as a charger integrated circuit and component communications supported through component bus communications like I2C and SMBus as well as USB (Universal Serial Bus) managed through a USB hub. Embedded controller 28 communicates with a battery management controller (BMC) that monitors and manages conditions within battery 42, such as with a microcontroller unit (MCU) or ASIC (application specific integrated circuit) that monitors voltage, current, charge and discharge from battery cells that cooperate to present as a battery through a battery connector 46 that interfaces with a battery receptacle 44 of motherboard 22. In the example embodiment, battery connector 46 couples directly to battery 42 aligned to slide into battery receptacle 44 that is surface mounted to motherboard 22. When external power is available, battery connector 46 communicates power to charge battery 42. When external power is not available or is insufficient to operate the processing components, battery 42 discharges through battery connector 46 to battery receptacle 44 to provide power to operate the processing components. Embedded controller 28 communicates with a BMC of battery 42 through an SMBus communication link or similar communication link so that the battery maintains desired operating constraints, such as a minimum and maximum voltage, thermal constraints, maximum discharge rates and similar operating conditions. In the example embodiment, cutting off communication between the battery and embedded controller results in the battery cutting off power transfer. An exception is made with a positive battery output maintained on one pin that routes through motherboard 22 to power a real time clock 48, which tracks time when system power is cut off.

Figure 2:
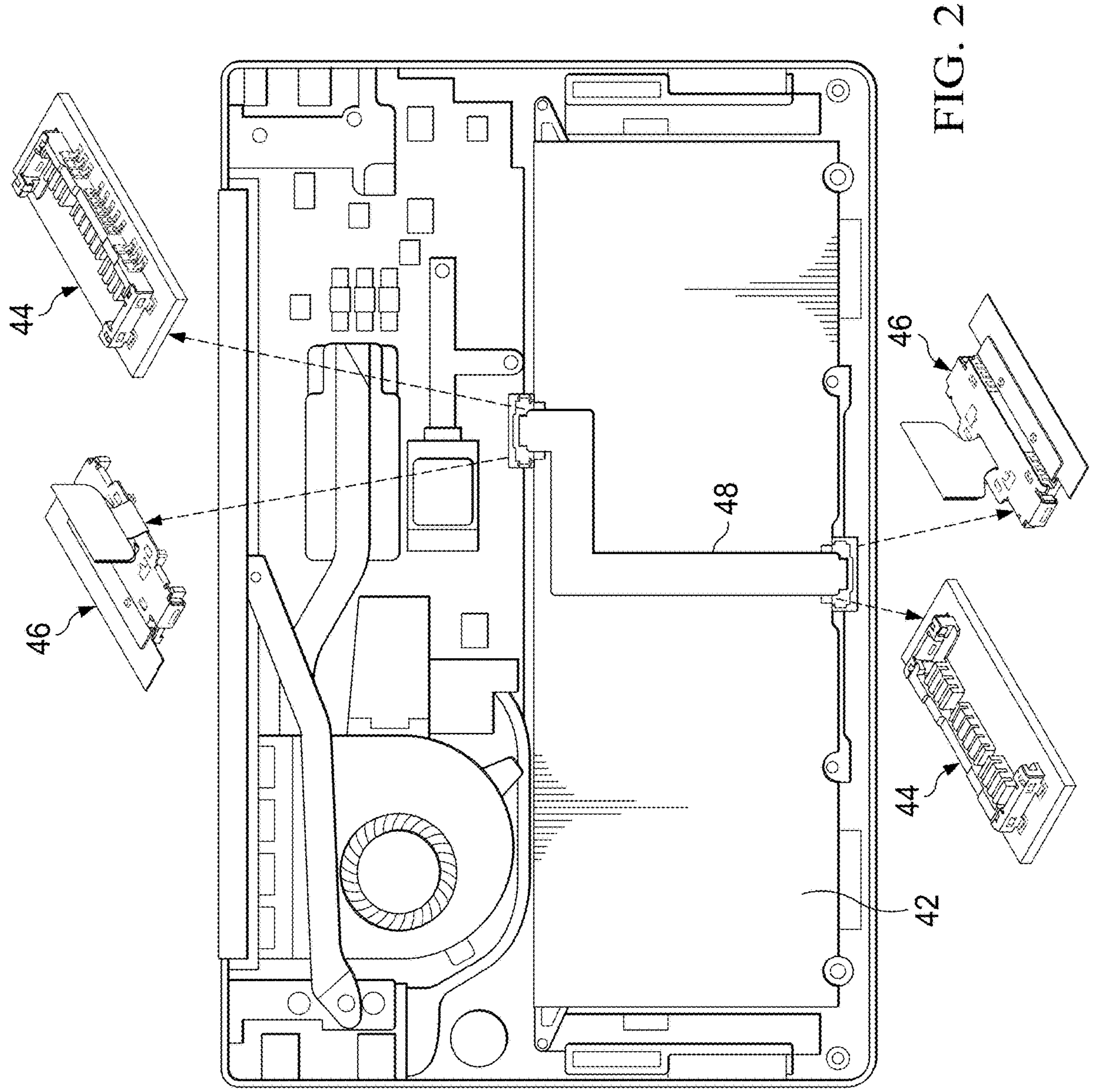
FIG. 2 depicts various embodiments to interface a battery with a portable information handling system.

Referring now to FIG. 2, various embodiments are depicted to interface a battery 42 with a portable information handling system 10. A cable 48 terminates at one end with a battery connector 46 that inserts into a battery receptacle 44 coupled to a motherboard of the information handling system. Battery cable 48 terminates at a second end with a battery connector 46 that inserts into a battery receptacle 44 coupled to battery 42. In the example embodiment, the battery connector and receptacle are configured with interchangeable components to support a battery interface in a wide variety of system layouts. As an example, the battery connector may slide horizontally into the battery receptacle and snap in place or may press vertically into the battery receptacle and snap in place. An intervening cable may interface the battery and motherboard through a set of connectors and receptacles. The connector and receptacle may connect directly to a motherboard and battery or interface through a flexible printed circuit board or rigid printed circuit board. The various configurations are supported with a common and simplified hardware assembly of interchangeable parts.

Figure 3A:
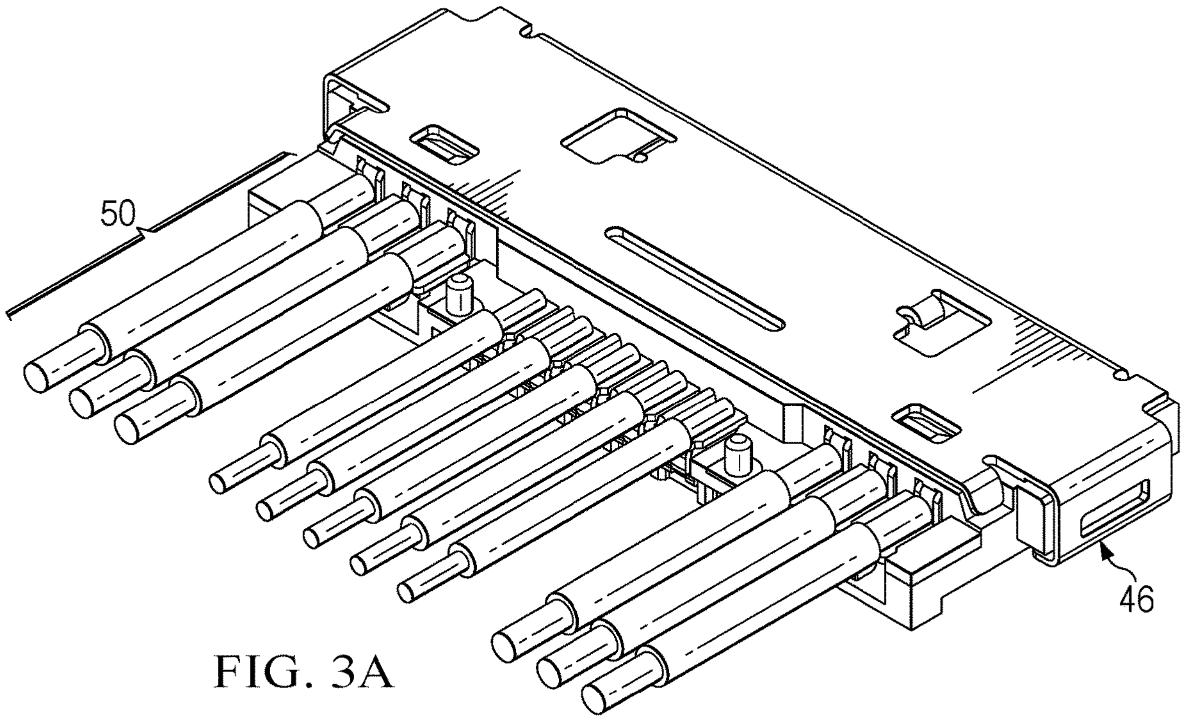
Figure 3B:
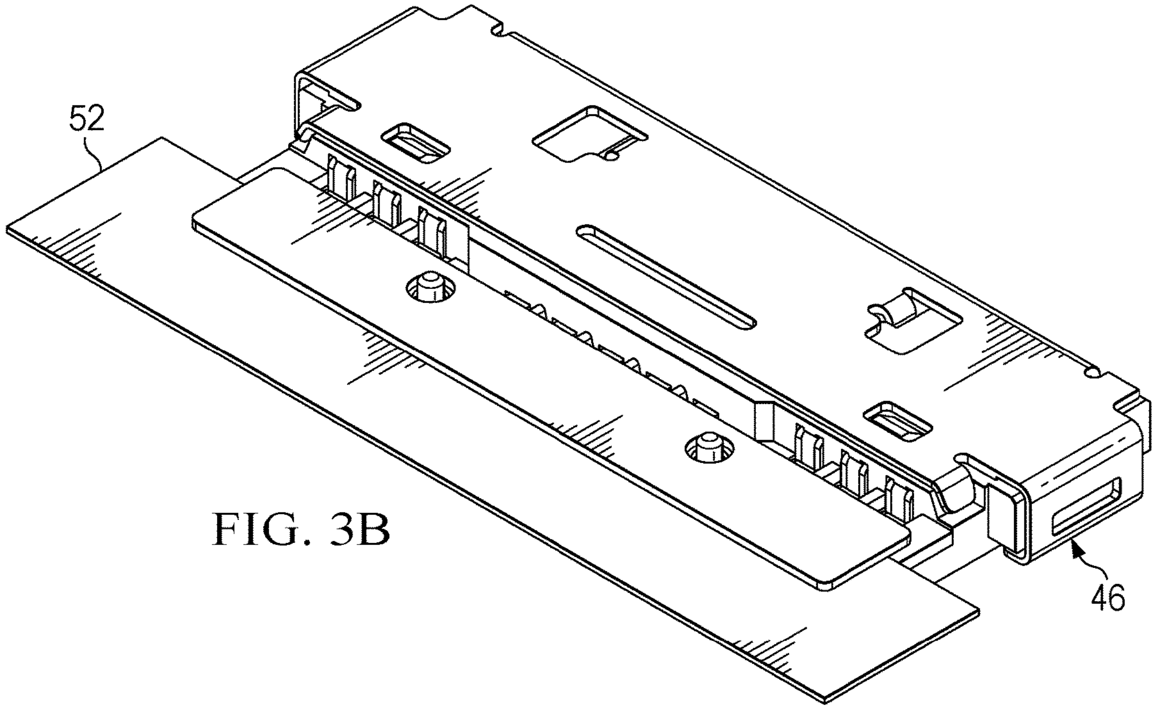
Figure 3C:
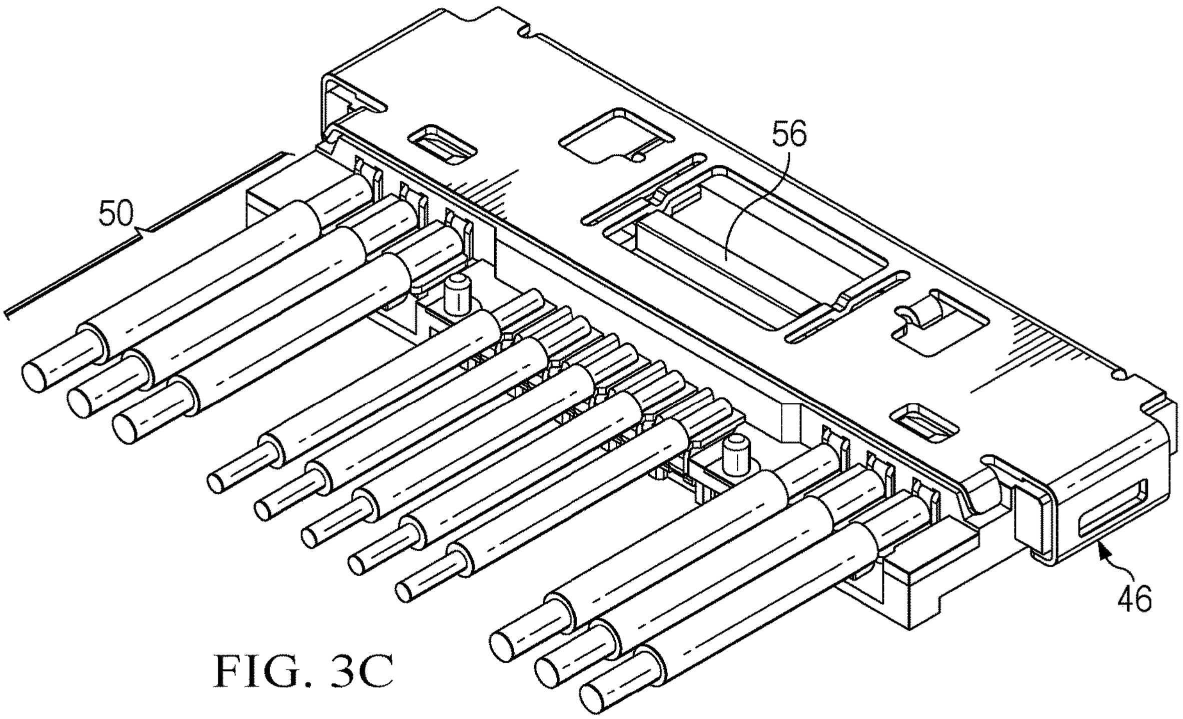
Figure 3D:
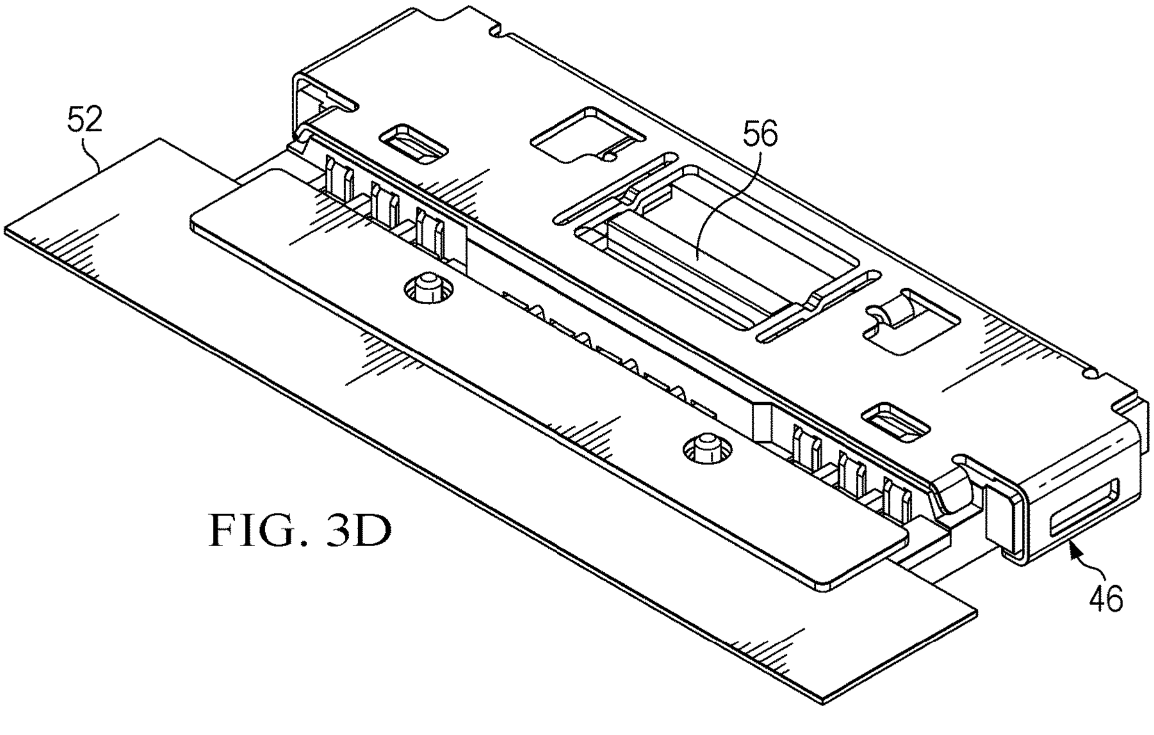
Figure 3E:
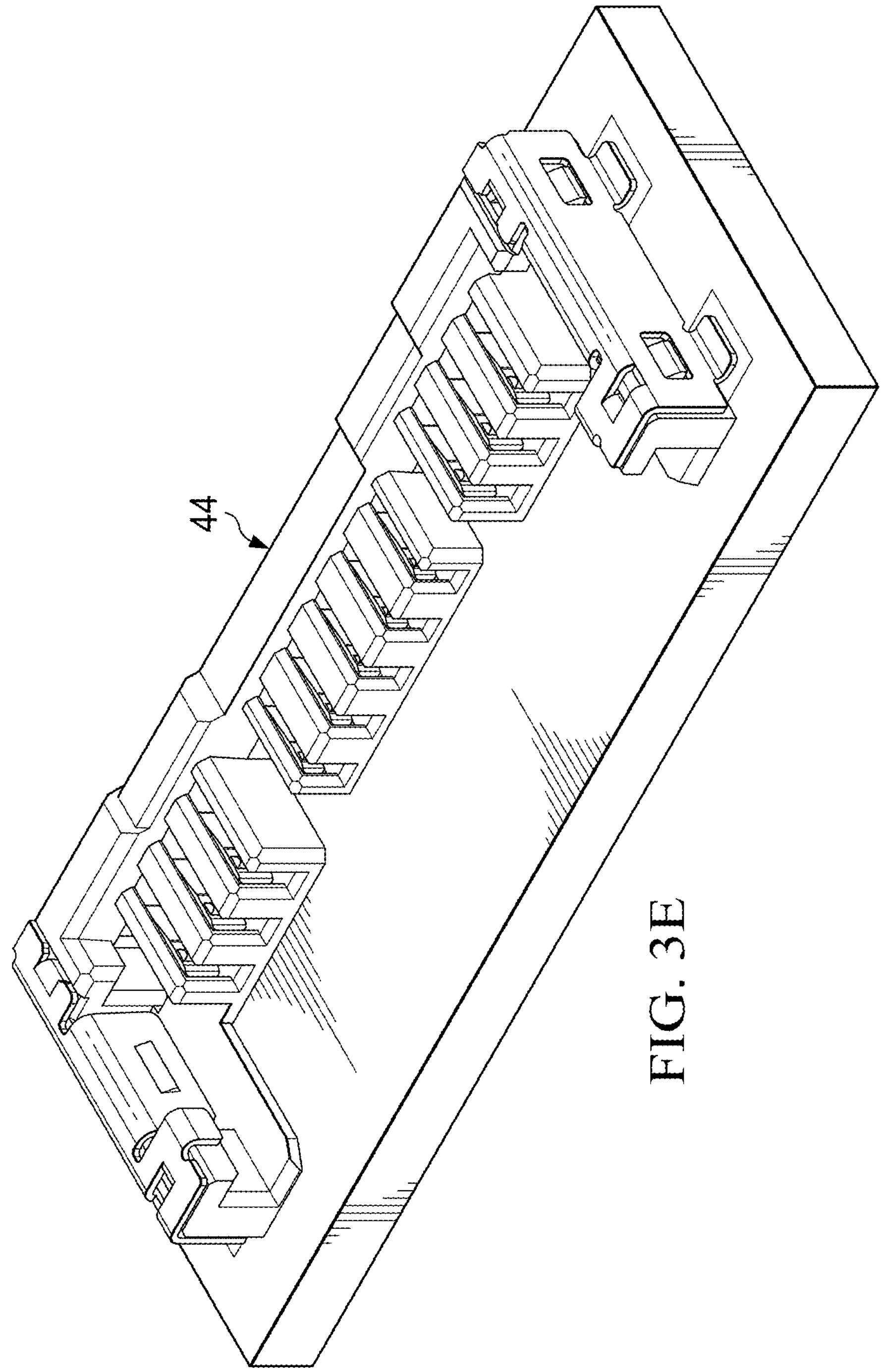
Figure 3F:
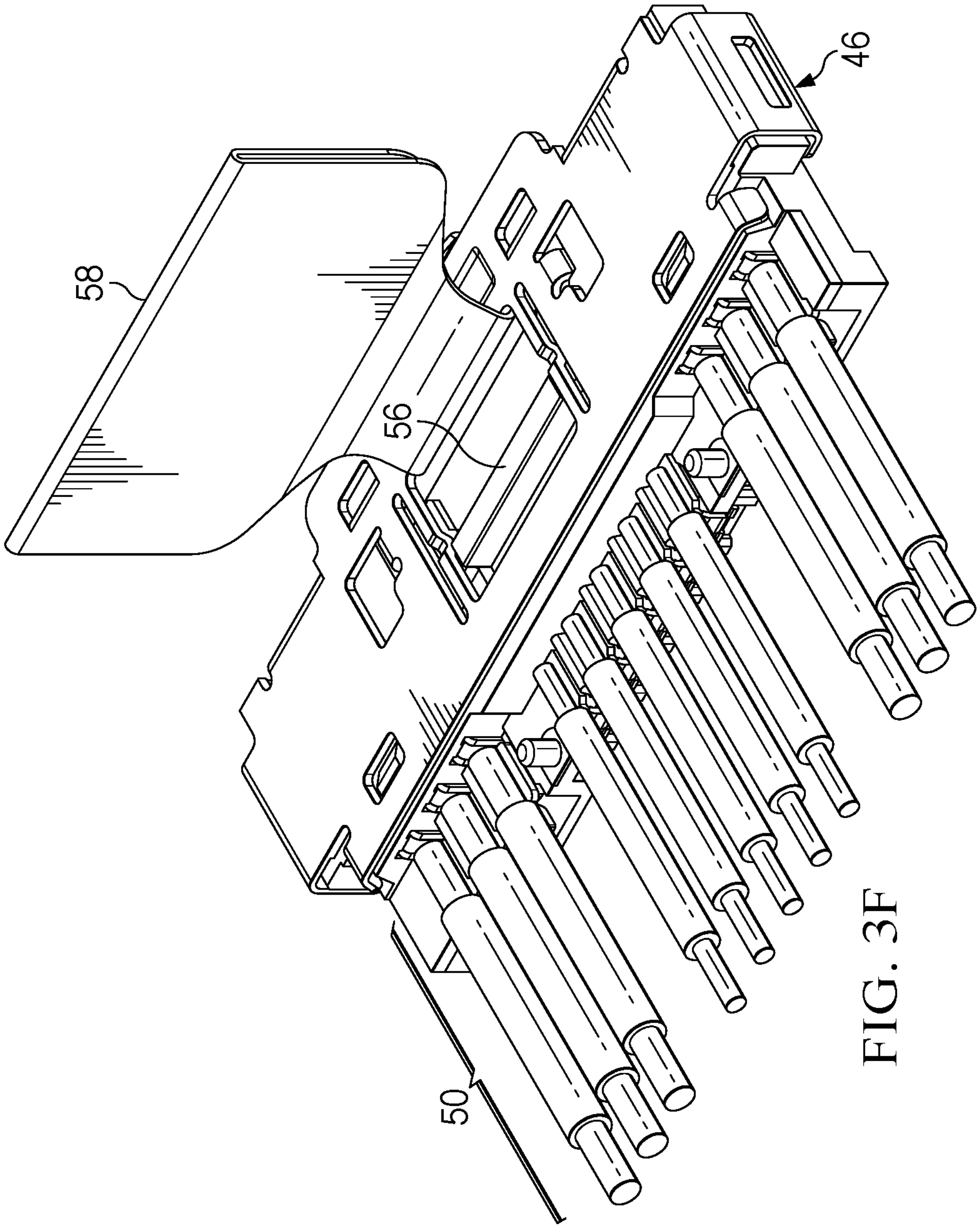
Figure 3G:
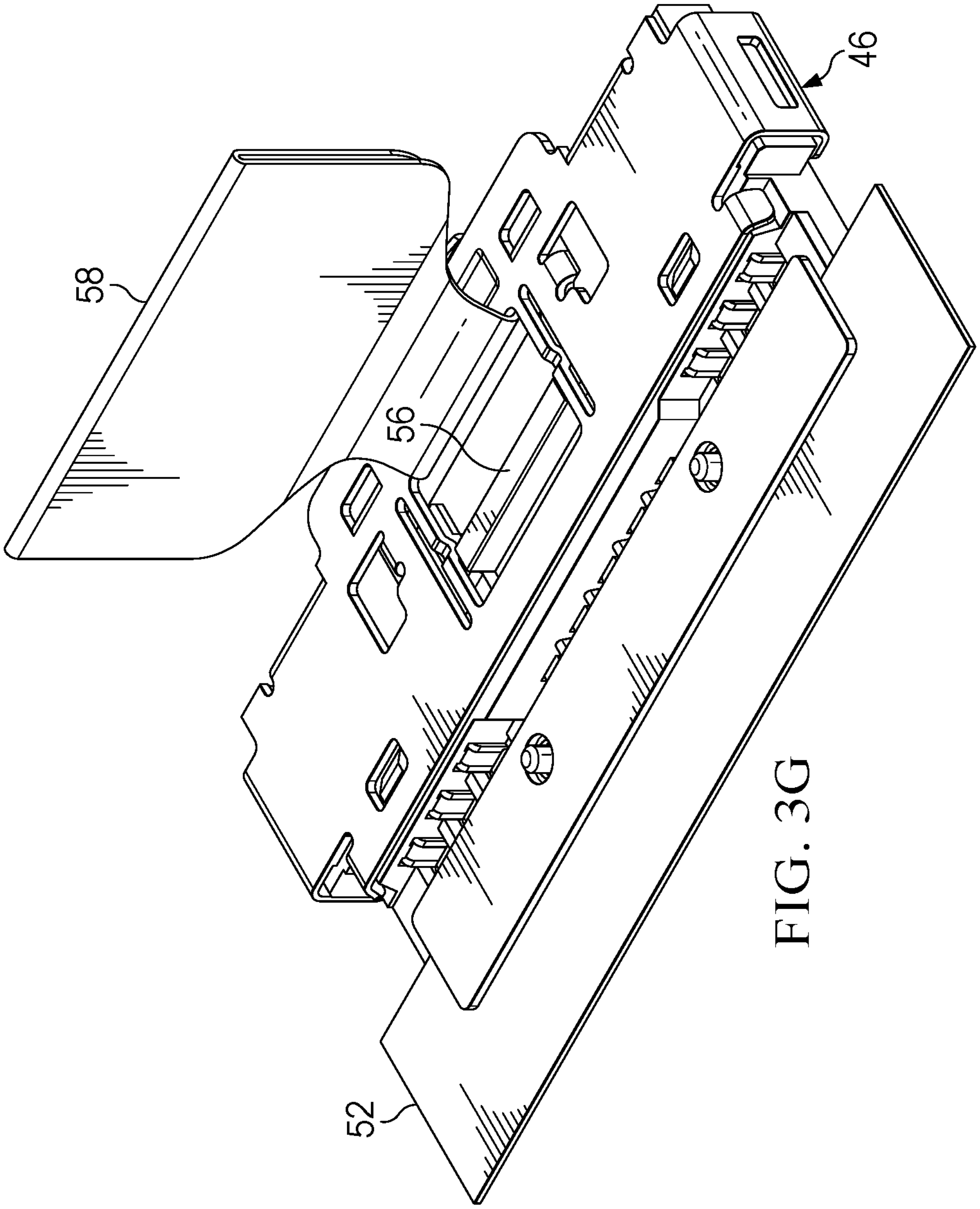
Figure 3H:
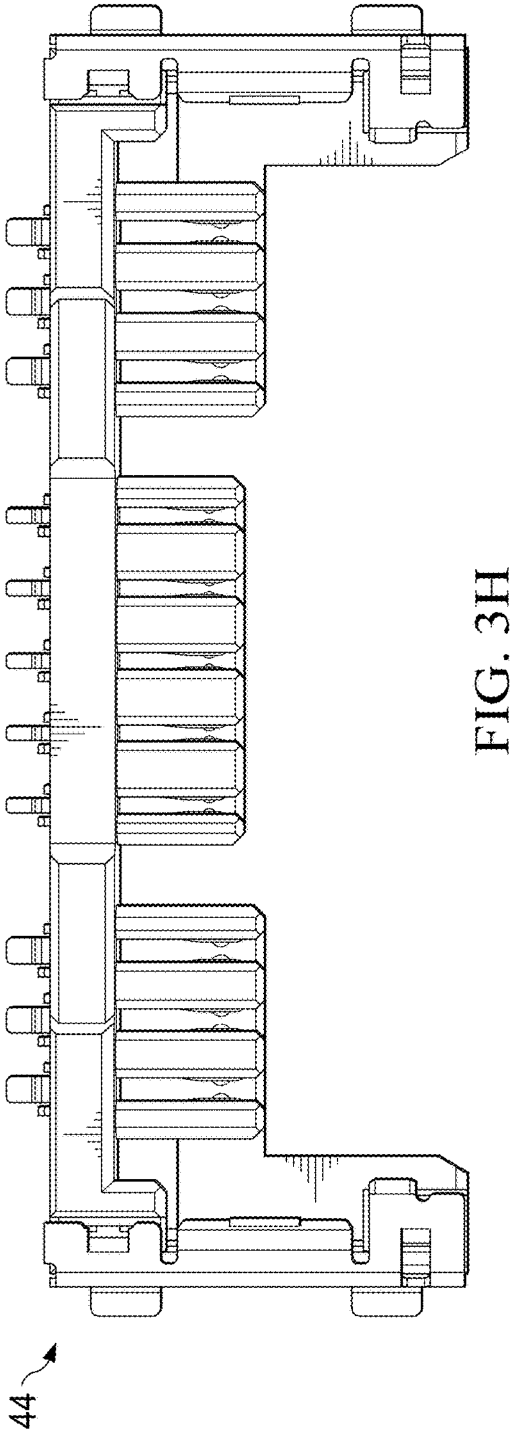
Figure 3I:
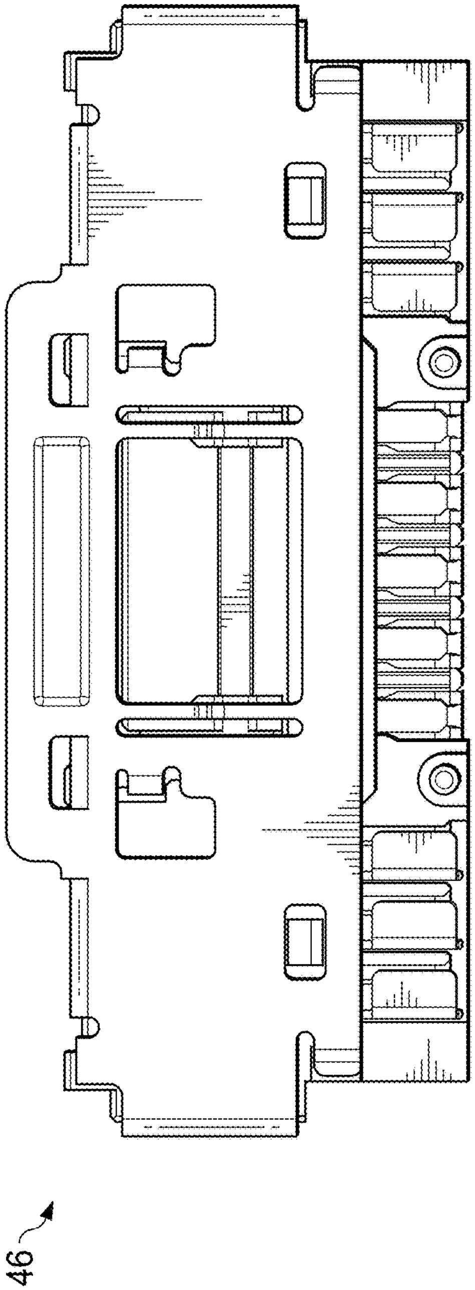

Referring now to FIG. 3A through 3J, examples of different types of battery connector and battery receptacle configurations are depicted. In the example embodiments, a battery receptacle 44 depicted in FIG. 3E couples to a motherboard with a single configuration that is adapted to accept battery connectors 46 of different configurations and common components. FIG. 3J includes a table that lists example dimensions for the battery receptacle with a 3-5-3 or 4-5-4 pin configuration in a 2.2 mm height, such as the example shown by FIG. 3H. The 3-5-3 pin configuration has a width of 22.6 mm and length of 8.0 mm, while the 4-5-4 configuration has a greater width of 25 mm to accommodate an extra positive pin and an extra ground pin for greater rates of power transfer. The table of FIG. 3J includes example dimensions for the battery connector configured with 3-5-3 and 4-5-4 pin configurations and to couple with a horizontal and vertical insertion, such as the example of FIG. 3I. Generally, battery connector 46 has a horizontal fit or a vertical fit into battery receptacle 44. Each configuration will have a slightly different width and length as detailed in the table. In addition, each of the vertical and horizontal fits may include a switch 56 to turn off battery power or may have a direct interface without an on/off switch control. In one configuration, battery connectors interface with a battery through a set of individual wires 50 that solder in place. In an alternative configuration, battery connectors interface with a battery through a flexible printed circuit board 52. FIG. 3A depicts battery connector 46 having a wire 50 battery connection without a switch for horizontal insertion. FIG. 3B depicts battery connector 46 having a flexible printed circuit board 52 battery interface and no switch for horizonal insertion. FIG. 3C depicts battery connector 46 having a wire 50 battery connection with a switch for horizontal insertion. FIG. 3D depicts battery connector 46 having a flexible printed circuit board 52 battery interface and a switch for horizonal insertion. FIG. 3F depicts battery connector 46 having a wire 50 battery connection with a switch for vertical insertion and having a tab 58 to pull on for removal of the connector from the receptacle. FIG. 3G depicts battery connector 46 having a flexible printed circuit board 52 battery interface and a switch for vertical insertion with a tab 58 to pull on for removal. Although not depicted in the example embodiments, both wire and flexible circuit board battery interfaces may be supported without a switch. In other alternative configurations, the battery connector couples to a rigid printed circuit board, such as directly connect to a battery for insertion with the battery next to a motherboard.

Referring now to FIG. 4, a table depicts an example pin configuration of a 3-5-3 battery connector and battery receptacle. In the example embodiment, the first three pins are connected to positive terminals of the battery and the last three pins are connected to ground terminals of the battery. When the battery has a higher power capacity, a fourth positive and ground terminal may be included to manage the additional power transfer. The middle five pins 4 through 8 are communication pins to support communication between the battery and motherboard components. In the example embodiment, pins 4 and 5 support an SMBus data and clock link that the battery and embedded controller use to coordinate battery charge and discharge. Pins 6 and 7 communicate system present and battery present signals, such as by pin hi to low signals at the battery management controller and the embedded controller. Pin 8 is unassigned and available as described below to provide a battery output of a controller voltage to support a real time clock on an information handling system. For instance, the battery management controller regulates the output to 5 VDC (5 volts direct current) so that the real time clock receives battery power when the battery is present even if the battery is not operational. In alternative embodiments, other pin arrangements may be used for the communication links.

Figure 5A:
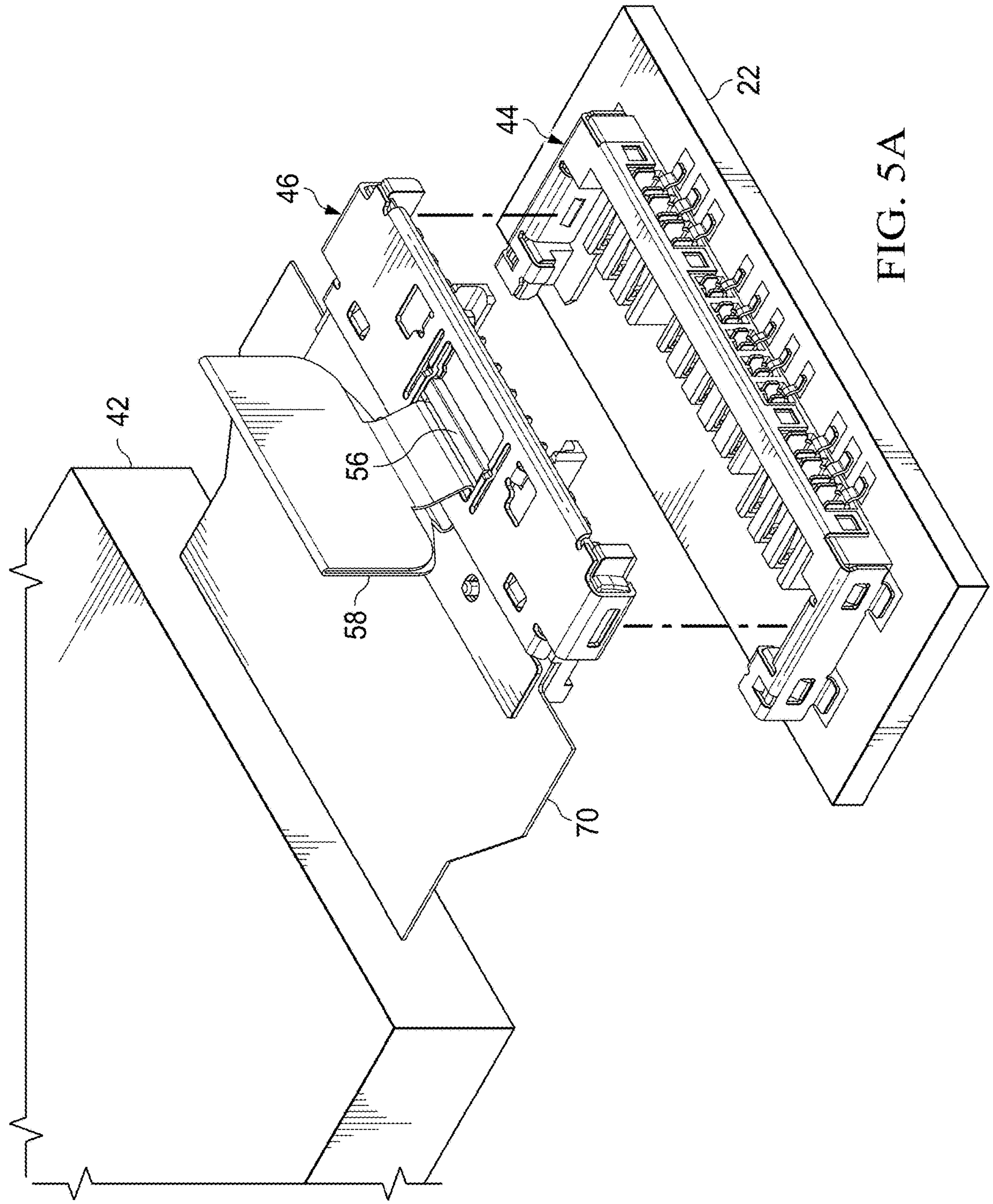
FIGS. 5A and 5B depict direct battery side and battery side on a printed circuit board interfaces with a vertically inserted battery connector coupling to a battery receptacle.
Figure 5B:
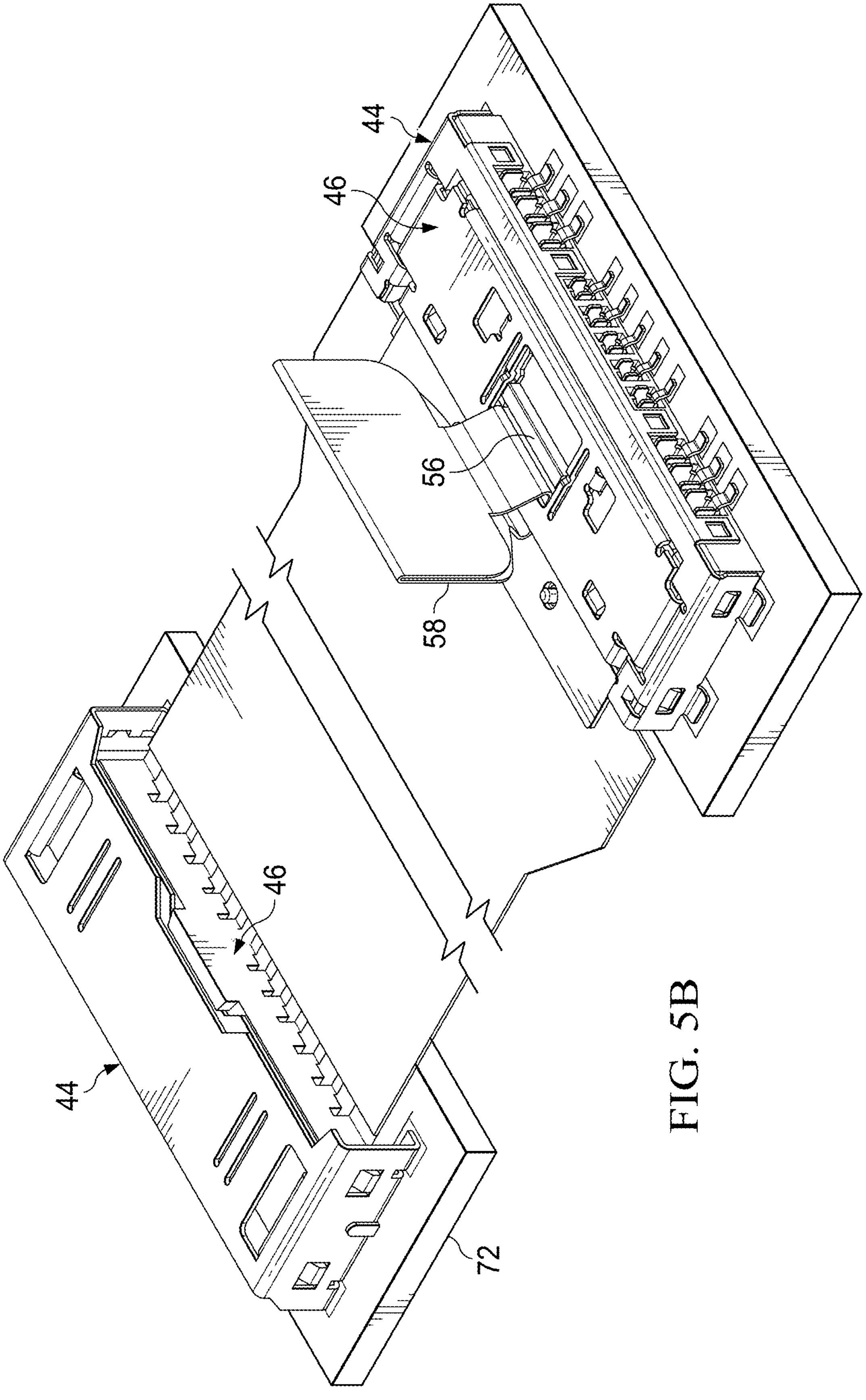

Referring now to FIGS. 5A and 5B, direct battery side and battery side on a printed circuit board interfaces are depicted with a vertically inserted battery connector coupling to a battery receptacle. FIG. 5A depicts a battery connector 46 aligned for a vertical press down into a battery receptacle 44 coupled to a motherboard 22. Battery connector 46 interfaces with battery 42 through a flexible printed circuit board configured as a cable 70. Tab 58 extends upward to offer a grip for an end user that aids in the press down and a lift up to remove the battery connector. In the example embodiment, a switch 56 is included in battery connector 46 and exposed at the upper surface to turn the battery and motherboard interface for power transfer on and off. FIG. 5B depicts an alterative embodiment where a battery receptacle 44 couples to a rigid printed circuit board (PCB) 72 at a battery side, such as rigid PCB mounted at the battery outer surface and cable interfaces to a motherboard battery receptacle 44 having a battery connector 46 pressed down into position. Tab 58 is available to aid connector manipulation and switch 56 turns battery and motherboard interactions on and off.

Figure 6:
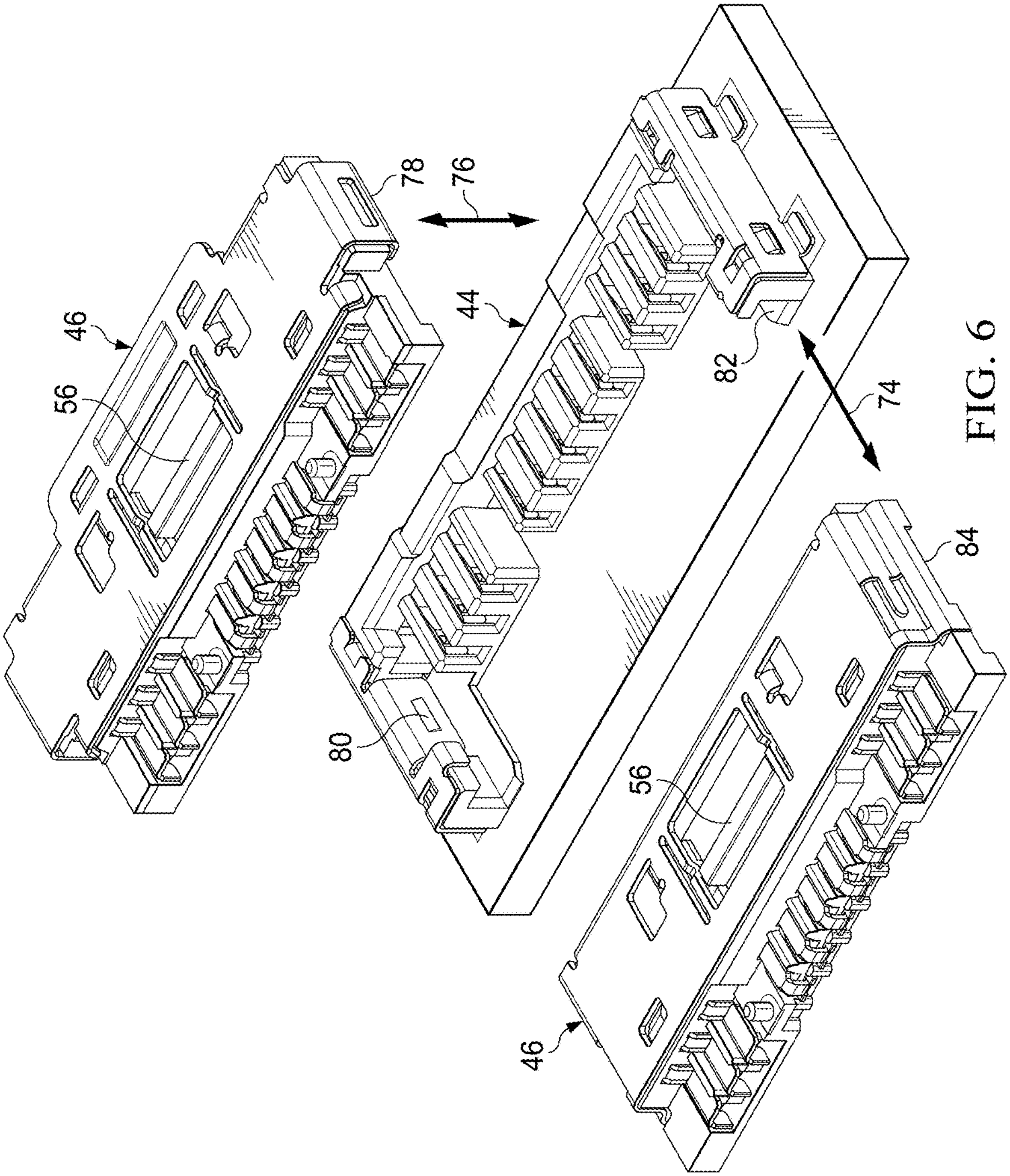
FIG. 6 depicts a side perspective view of an example of a vertical press down insertion and a horizontal sliding insertion of a battery connector into a battery receptacle.

Referring now to FIG. 6, a side perspective view depicts an example of a vertical press down insertion and a horizontal sliding insertion of a battery connector into a battery receptacle. Horizontal sliding insertion indicated by arrow 74 engages a rail 84 on the side surface of battery connector 46 with a rail lip 82 of battery receptacle 44. Vertical press down insertion indicated by arrow 76 engages an extension 78 of battery connector 46 with a press guide 80 of battery receptacle 44. In one embodiment, battery connector 46 has a different cover coupled over the conductor frame to expose either the sliding rail or extension to engage with the battery receptacle. A plug detector included in battery receptacle 44 detects the type of battery connector that interfaces with the battery receptacle and reports the type of connection to the embedded controller.

Figure 7A:
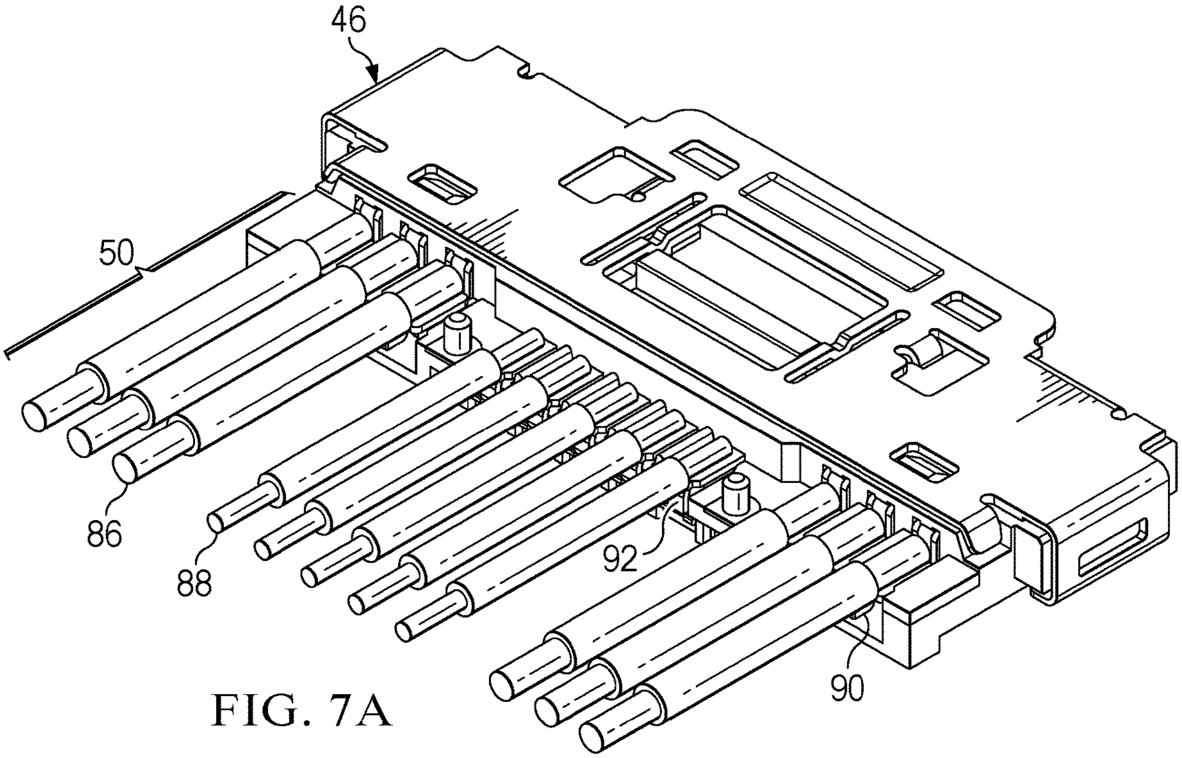
FIGS. 7A and 7B depict an example embodiment of a battery connector having wires coupled to conductive elements that interface with a battery receptacle.
Figure 7B:
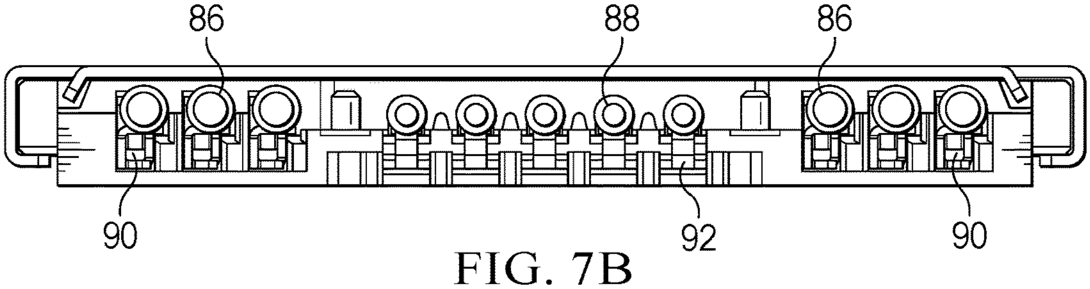

Referring now to FIGS. 7A and 7B, an example embodiment depicts a battery connector 46 having wires coupled to conductive elements that interface with a battery receptacle. Plural wires 50 individually solder to a tin upper surface of conductive elements exposed at the battery connector opposite its insertion side. A larger gauge wire 86 solders to the outside three conductive elements 90 to provide adequate power transfer to and from the battery. An smaller gauge wire 88 solders to the inner five conductive elements 92 to communicate information. As FIG. 7B illustrates, conductive wires 86 and 88 rest on their respective conductive elements 90 and 92 with the bottom side of the wire in a common plane. A gap is formed in each conductive element 90 and 92 so that the wire is caught in place for soldering and isolated from adjacent wires, such as with a nonconductive material like plastic. In one example embodiment, conductive wires 86 are #24 gauge and conductive wires 88 are #28 gauge.

Figure 8A:
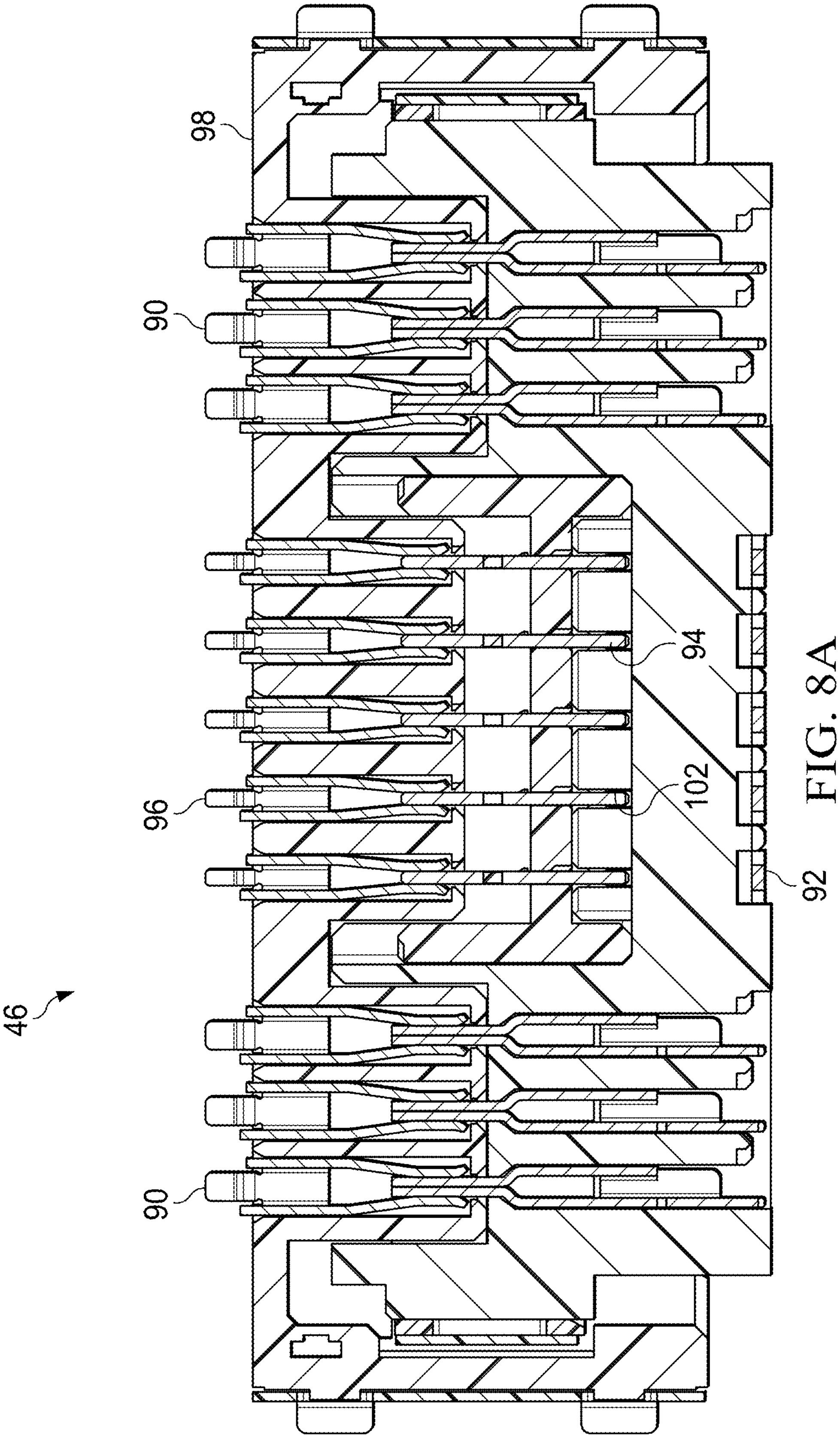
FIGS. 8A, 8B, 8C and 8D depict an example embodiment of power control with a switch integrated in the battery connector.
Figure 8B:
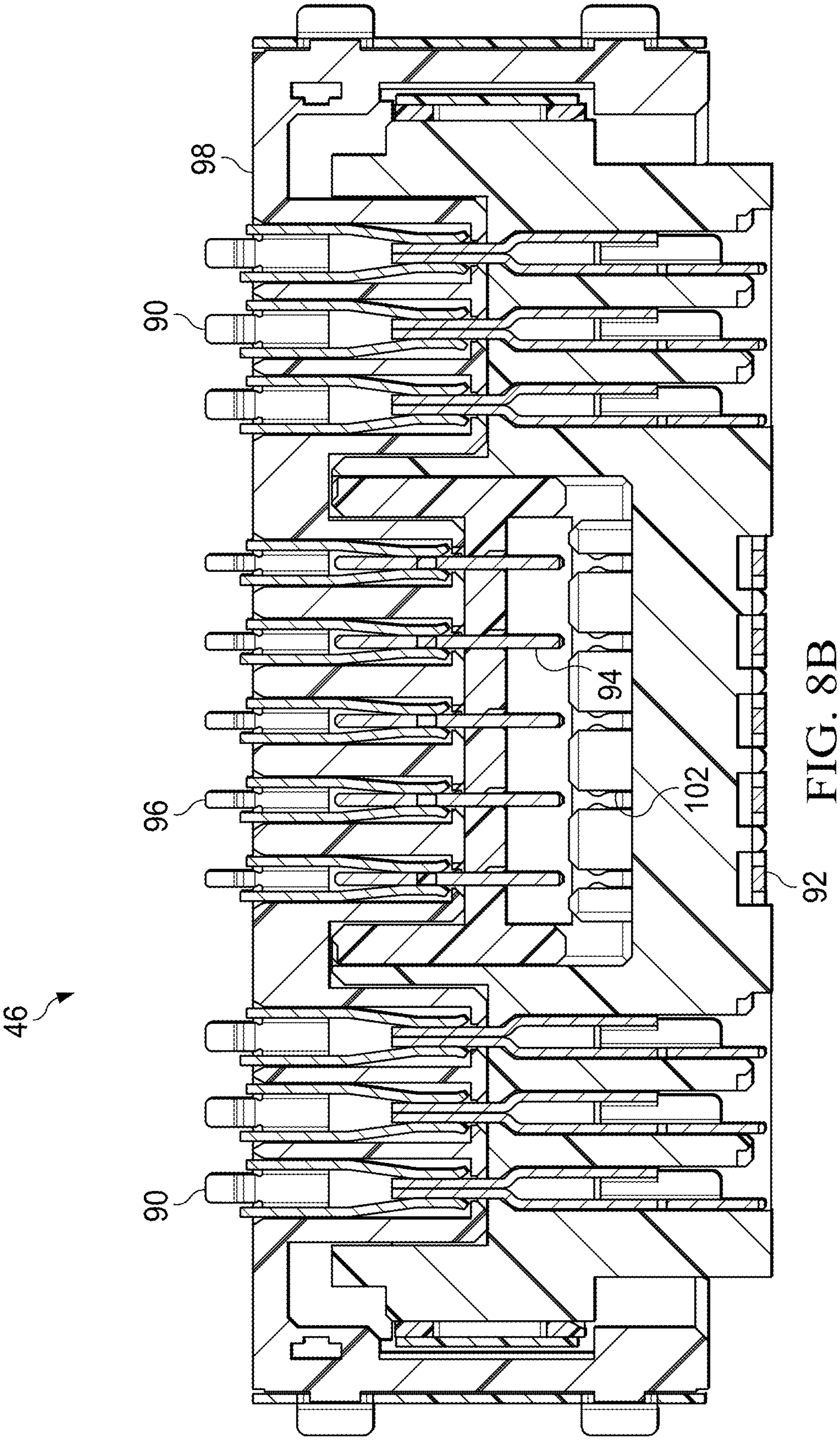
Figure 8C:
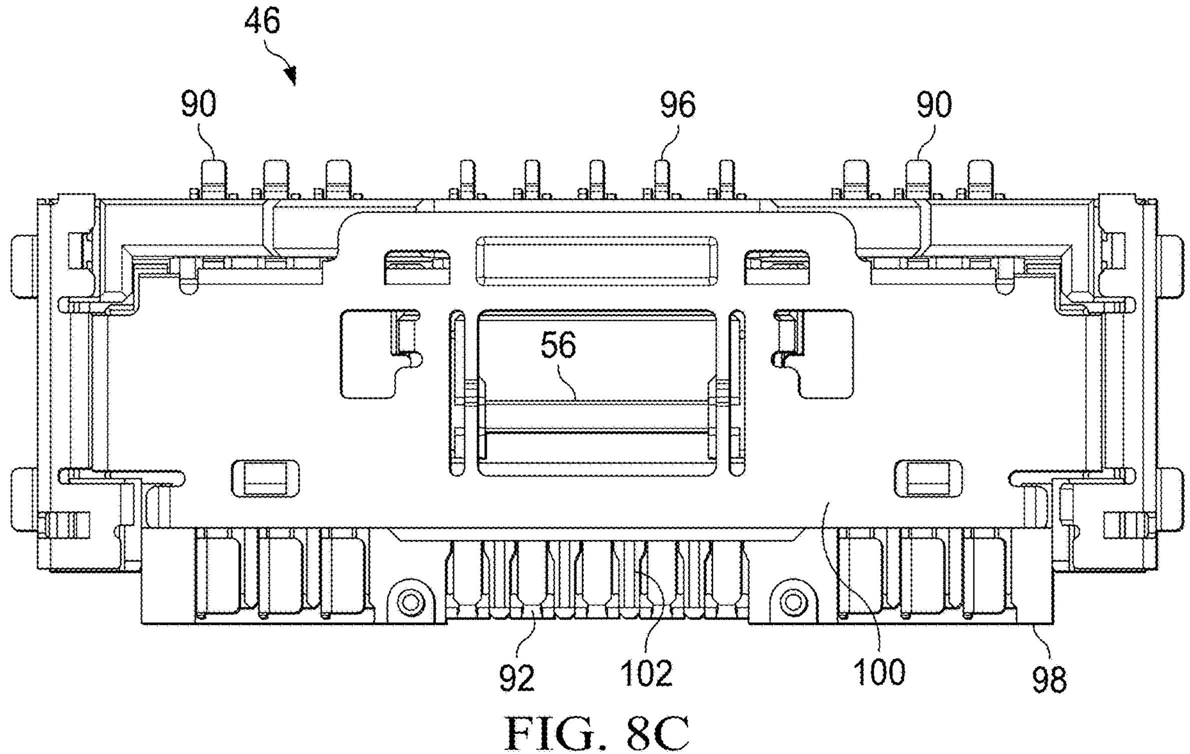
Figure 8D:
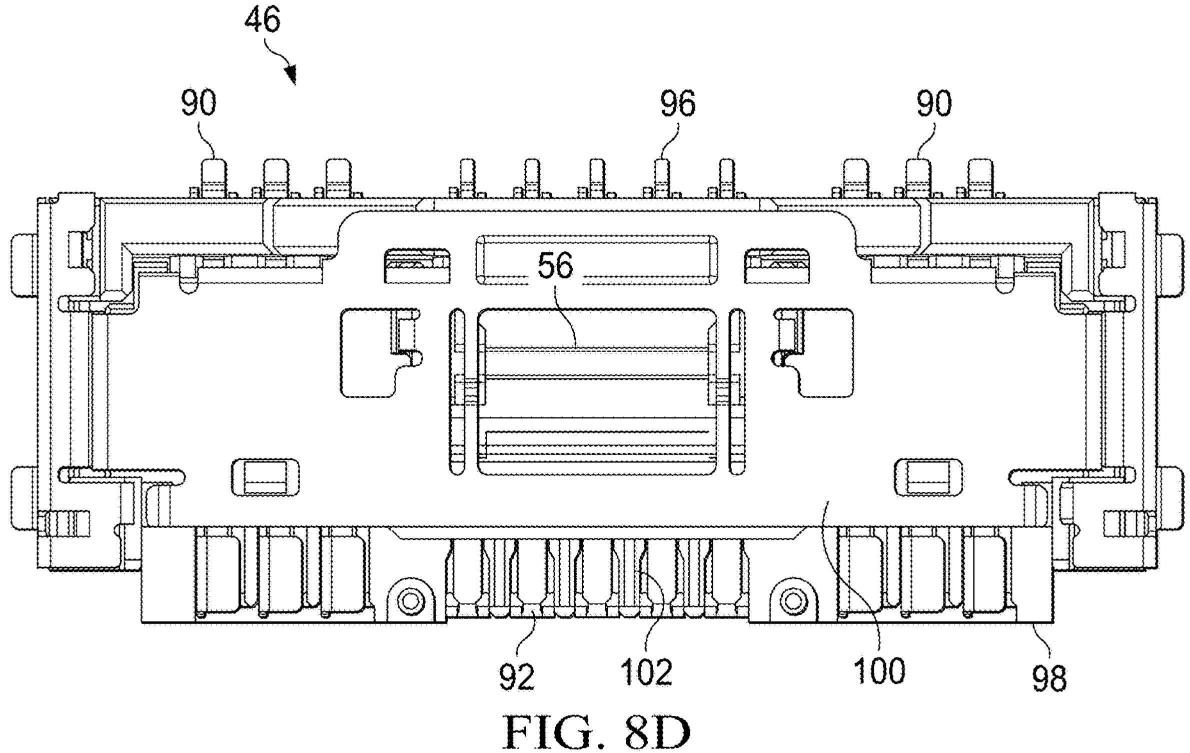

Referring now to FIGS. 8A, 8B, 8C and 8D, an example embodiment depicts power control with a switch 56 integrated in the battery connector. FIG. 8A depicts battery connector 46 with the cover removed to expose a nonconductive frame 98 that holds conductive elements 90 and 92 to communicate power and communications between a battery and a battery receptacle. Conductive elements 90 are disposed with three on each of opposing sides to communicate power and ground, and have a fixed conductive path between the insertion side where the conductive elements extend out and the battery connection side where conductive elements 90 have a gap in each conductive element that can accept a wire. As is described above, the power and ground wires have a larger gauge adapted to manage greater current and voltage. Fixing the conductive element 90 in place within the battery connector avoids sharp increases and decreases in voltage and current that might produce a spark or arc on connection and disconnection by a switch. Instead, conductive element 92 has an intermediate switch member 94 that selectively interfaces and removes a connection on the communication interfaces of the battery connector to conductive element 96 that extends out the insertion side of the battery connector. The moveable intermediate switch member 94 slides in a slot 100 defined by nonconductive frame 98. FIG. 8A depicts the switch in the closed position to support communication of battery information through battery connector 46 with a conductive path provided from conductive element 92 to conductive element 96 by intermediate switch member 94. FIG. 8B depicts the switch in an open position to cut off communication of battery information through battery connector 46 by separate intermediate switch member 94 from conductive element 92. When the conductive path for the center five pins is removed, that lack of SMBus communication results in the battery shutting off power transfer and the BMU and the embedded controller shutting of power transfer at the motherboard. FIG. 8C depicts switch 56 slid to the on position illustrated by FIG. 8A with conductive cover 100 coupled over the nonconductive frame 98. FIG. 8D depicts switch 56 slid to the off position illustrated by FIG. 8B with conductive cover 100 coupled over the nonconductive frame 98.

Figure 9A:
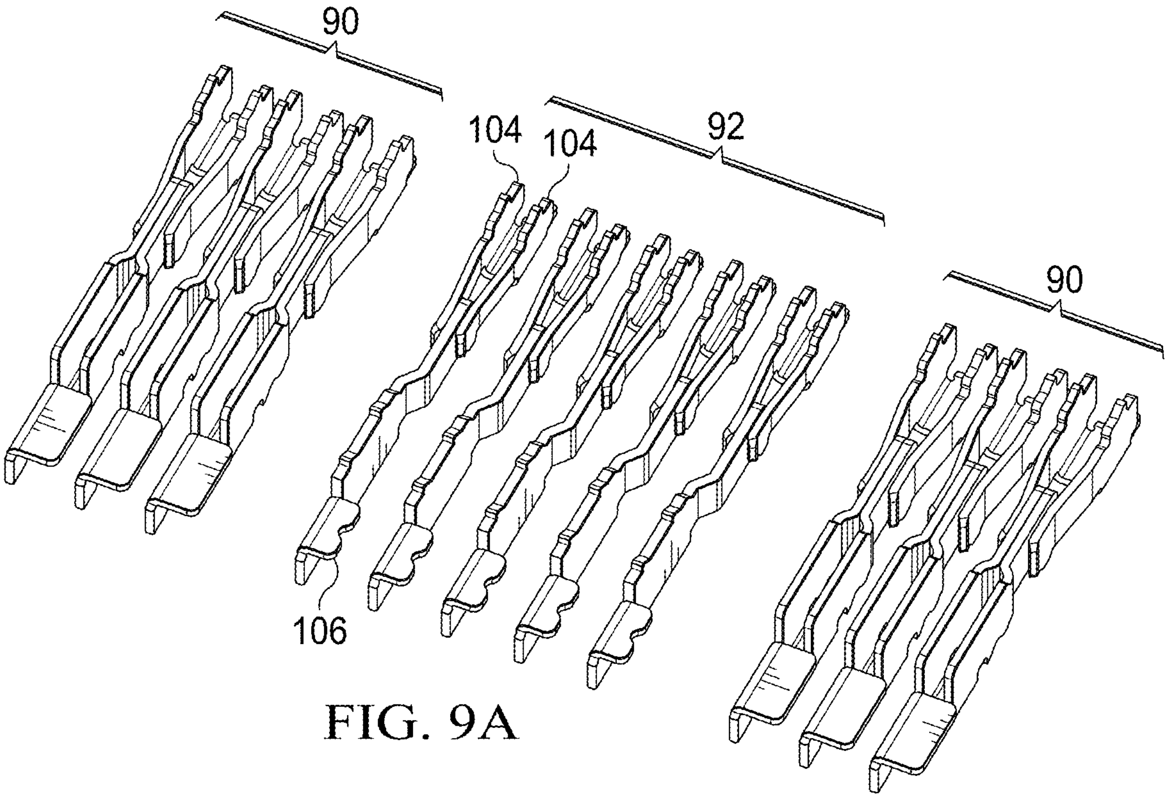
FIGS. 9A and 9B depict an alternative embodiment of the battery connector that communicates power and information without an integrated switch.
Figure 9B:
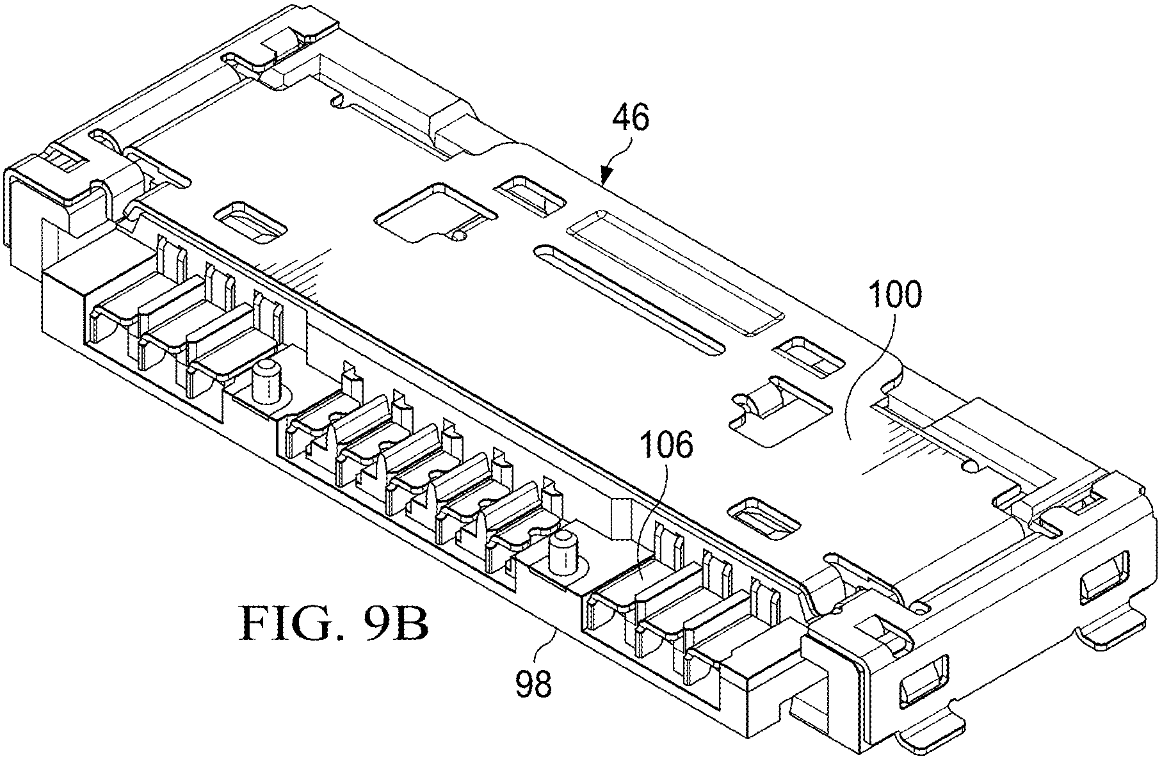

Referring now to FIGS. 9A and 9B, an alternative embodiment of the battery connector communicates power and information without an integrated switch. FIG. 9A depicts that all of the conductive elements 90 and 92 have a continuous conductive path from the spring fingers 104 that accept the conductive wires within their gap to the terminals 106 at the insertion end that couples into the motherboard battery receptacle. FIG. 9B depicts battery connector 46 having cover 100 coupled over nonconductive frame 98 to capture conductive elements 90 and 92 aligned to insert into the battery receptacle and without a switch at the upper surface to turn battery power transfer on and off.

Figure 10A:
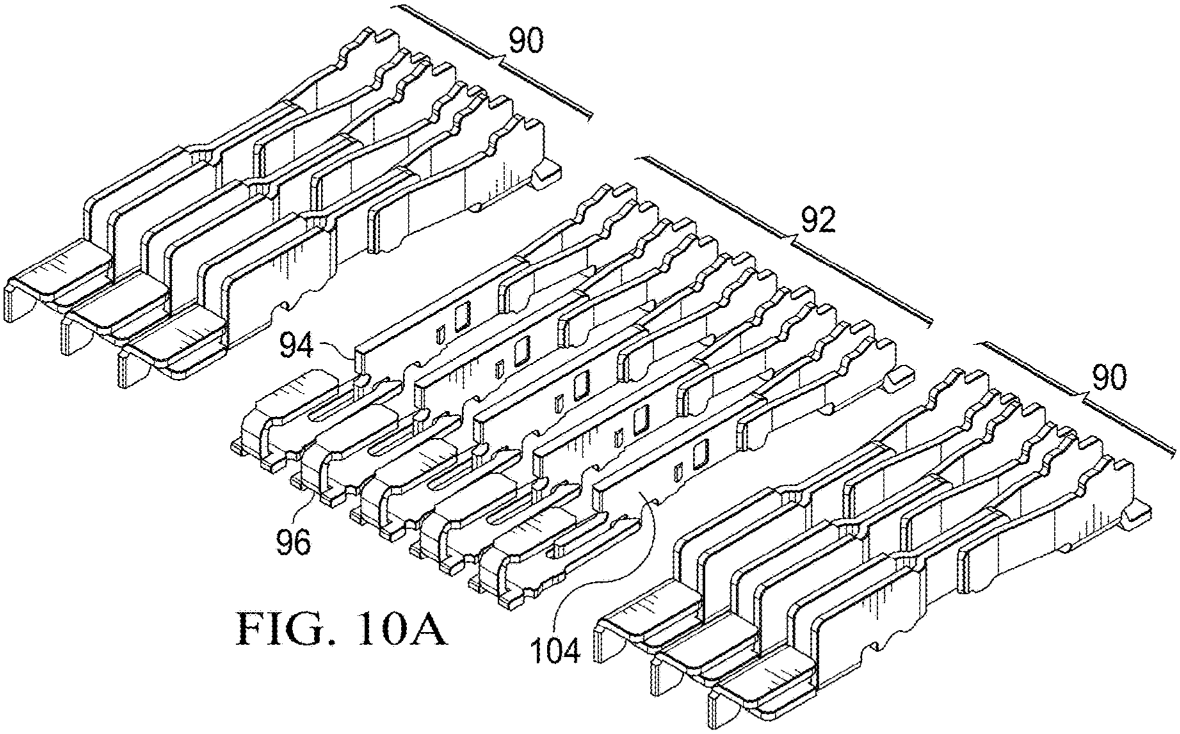
FIGS. 10A, 10B, 10C and 10D depict an alternative embodiment of the battery connector with an integrated switch that supports always on real time clock power transfer.
Figure 10B:
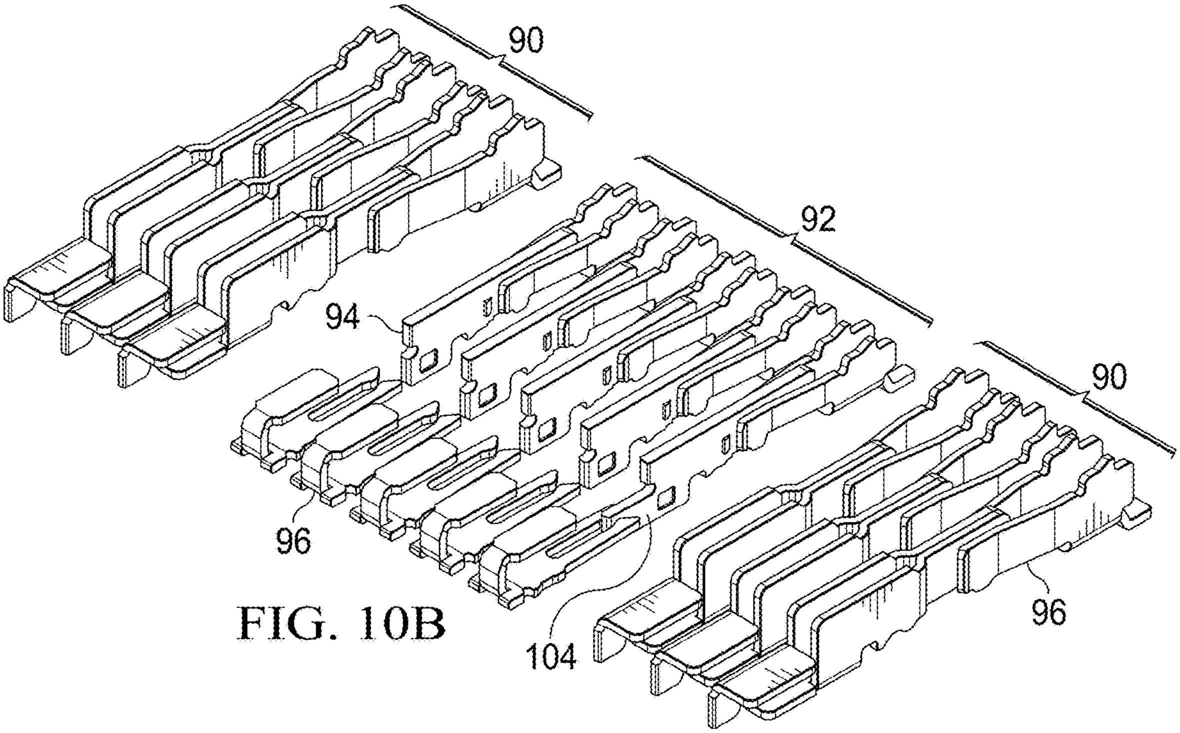
Figure 10C:
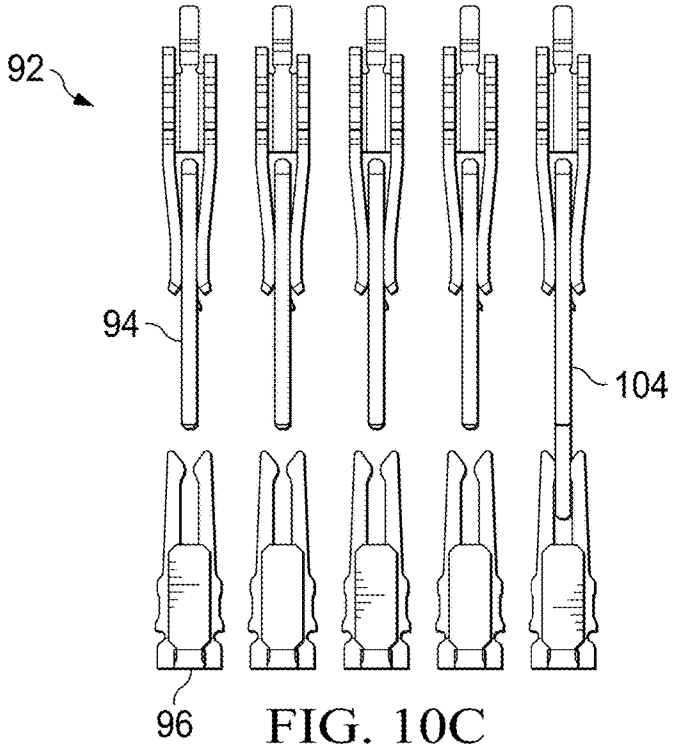
Figure 10D:
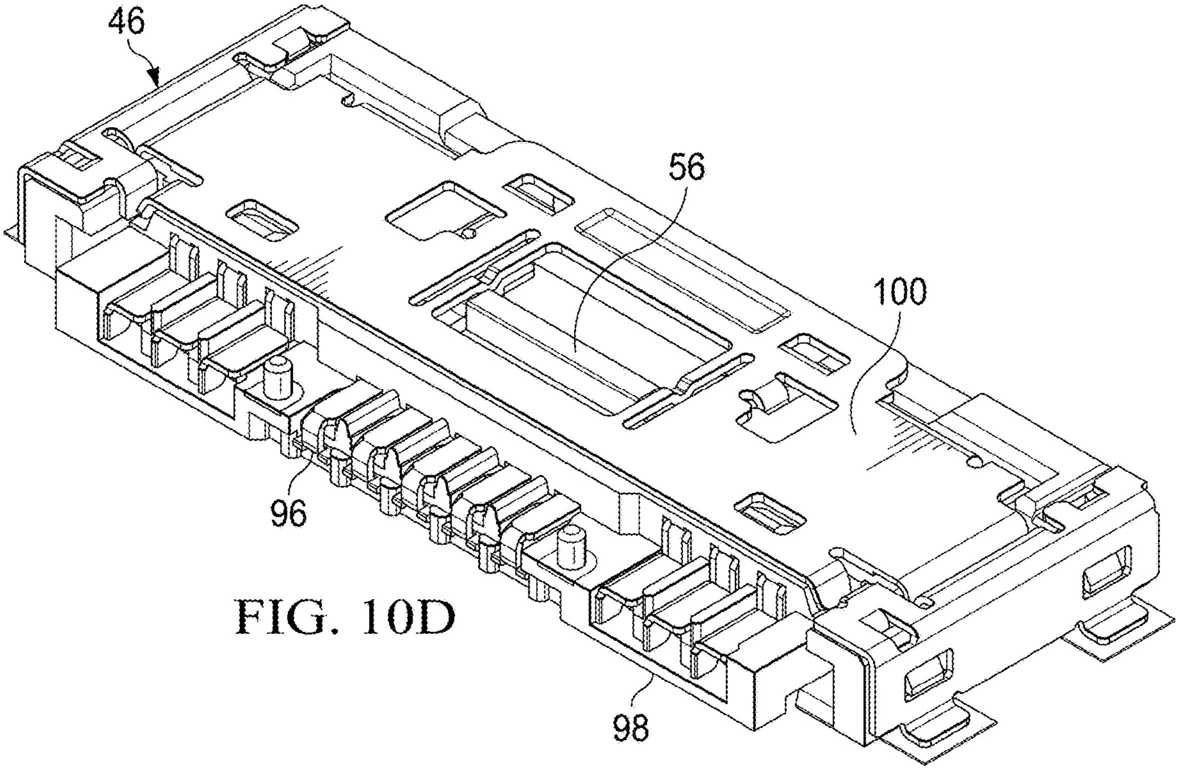

Referring now to FIGS. 10A, 10B, 10C and 10D, an alternative embodiment depicts the battery connector 46 with an integrated switch 56 that supports always on real time clock power transfer. FIG. 10A depicts conductive elements 90 that communicate ground and power between the battery and motherboard without physical interruption by movement of the switch, as described above. Communication through the center five conductive elements is provided when the switch is closed so that a conductive path exists from conductive element 92 to conductive element 96 through intermediate switch member 94. In the on the position, a real time clock communication is supported through a conductive intermediate switch member 104 that has a greater length than intermediate switch members 94. FIG. 10A illustrates that full battery operation is supported in the on position of the switch with all of the communication pins active and interfaced to communicate SMBus data that supports battery power transfer. FIG. 10B depicts the connector conductive element configuration when the switch moves to the open position to turn off battery power transfer. Although power and ground remain supported with a conductive path through conductive elements 90, the open position on the four intermediate members 94 cutoff power transfer by ending SMBus communication. The extended length intermediate switch member 104 maintains the conductive path so that power from the battery transfers to a motherboard wireline in communication with real time clock to power the real time clock. Ground for power transfer is present by the battery grounds of conductive elements 90. Logic executing from non-transitory memory of the battery management unit supplies voltage an current within the constraints of the real time clock. In one example embodiment, further sliding motion of intermediate switch member 104 may be arranged to allow cutoff of the real time clock power with the switch in a fully off position. FIG. 10C depicts intermediate switch members 94 in the off position with intermediate switch member 104 maintaining power transfer to the real time clock. FIG. 10D depicts an upper perspective view of battery connector 46 from the insertion side with the switch in the on position and cover 100 coupled over nonconductive frame 98. Although the example embodiment shows the switch moving switch member 104, in alternative embodiments a fixed member 104 may be used. Having the extended length that moves improves interchangeability with other types of battery connectors.

Figure 11:
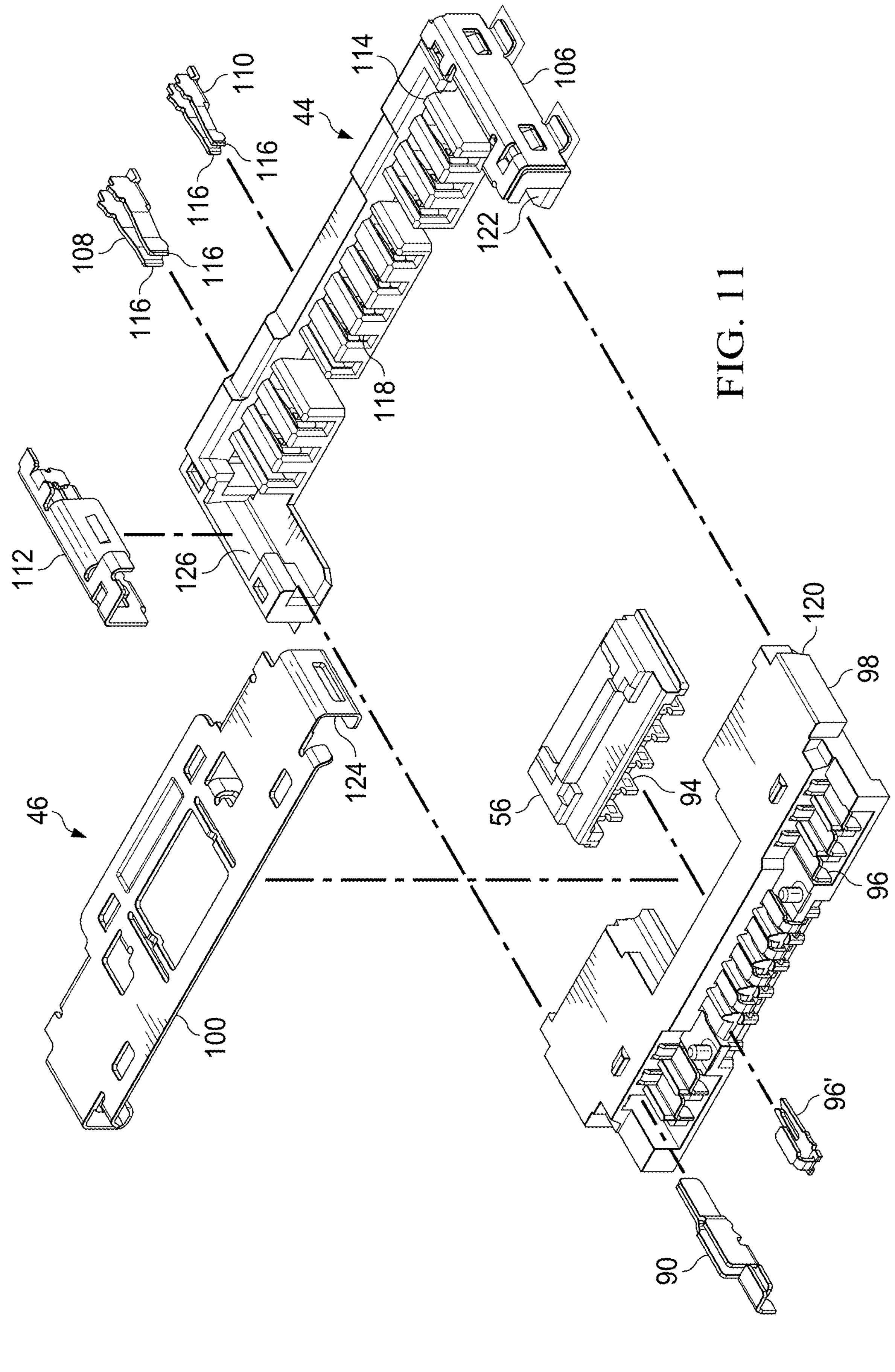
FIG. 11 depicts an exploded perspective view of a battery connector aligned to couple into a battery receptacle.

Referring now to FIG. 11, an exploded perspective view depicts a battery connector 46 aligned to couple into a battery receptacle 44. In the example embodiment, battery connector 46 has a switch 56 with intermediate switch members 94 fixed on a lower side to move with the switch between on/off and closed/open positions. A conductive cover 100 couples over nonconductive frame 98 to capture conductive elements 96 and 90. Element 96' depicts element 96 exploded out from nonconductive frame 98. Battery receptacle 44 has a nonconductive frame 114 with slots 118 that capture conductive members 108 for power and ground and conductive members 110 for communication. A pair of conductive endpieces 112 couple to opposing sides of nonconductive frame 114 to hold battery receptacle 44 to a motherboard. Conductive members 108 and 110 each have spring fingers 116 that fit around the ends of conductive elements 90 and, in this embodiment, the ends of the switch members when in the on position. The arrangement supports both a horizontal sliding insertion and a vertical press insertion of battery connector 46 into battery receptacle 44 with the conductive element end fitting into the spring fingers vertically or horizontally. Horizontal sliding alignment is provided by a rail 120 and 124 of the battery connector that slide into a guide 122 of the battery receptacle. Vertical pressing alignment is provided by the extension of rail 120 and 124 to fit into a slot 126 of battery receptacle 44.

Figure 12A:
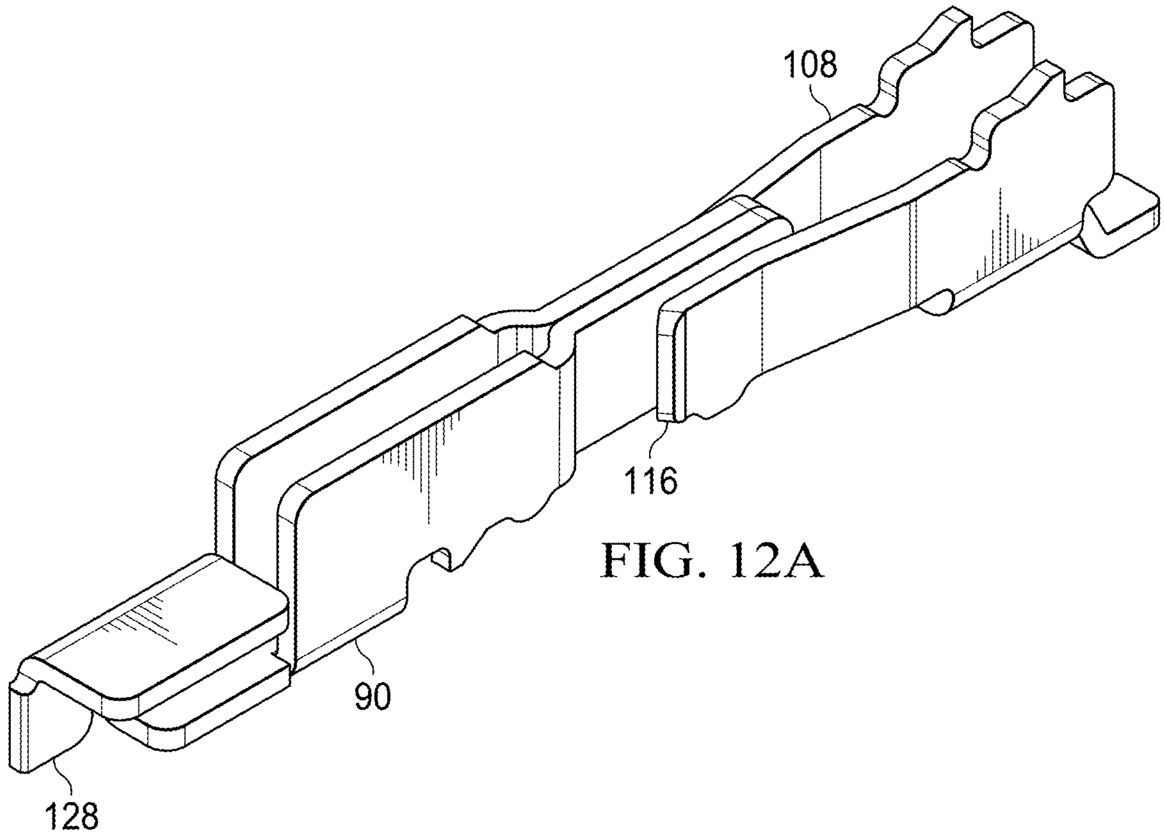
FIGS. 12A and 12B depict a side perspective view of coupling of conductive elements of the battery connector with conductive members of the battery receptacle.
Figure 12B:
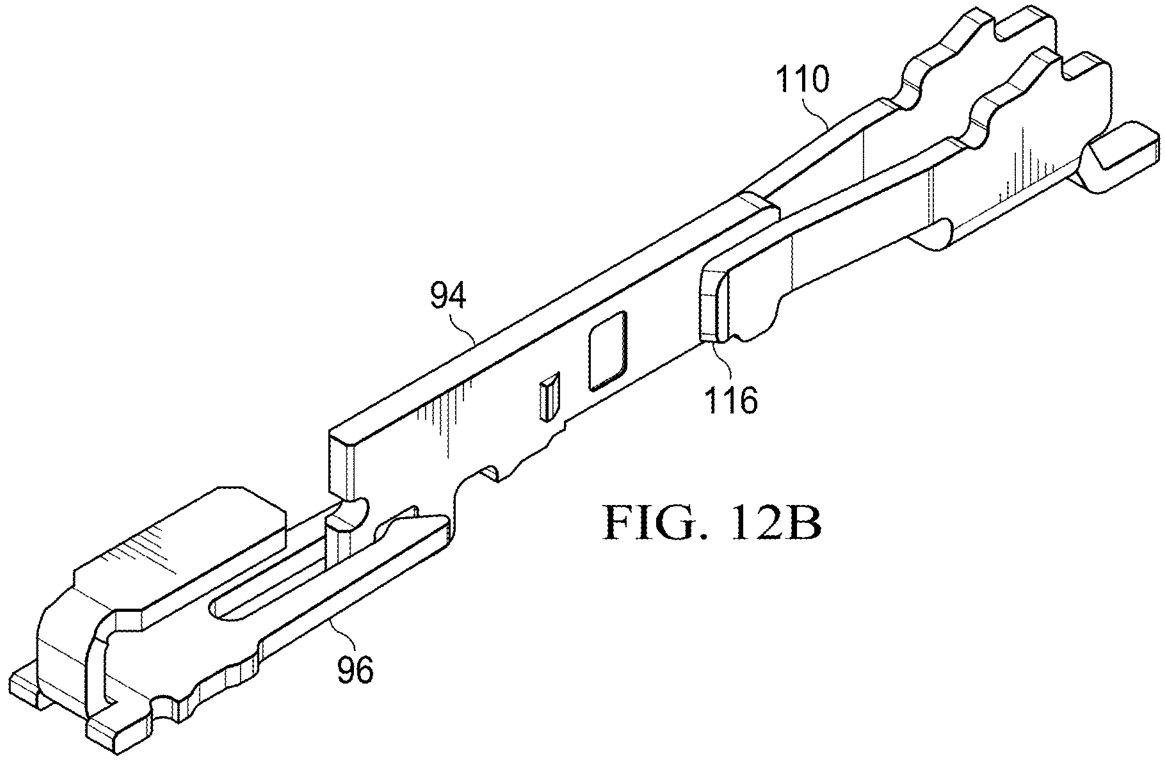

Referring now to FIGS. 12A and 12B, a side perspective view depicts coupling of conductive elements of the battery connector with conductive members of the battery receptacle. FIG. 12A depicts conductive element 90 having an end inserted into spring fingers 116 of conductive member 108 to support a transfer of power or ground. At the opposite end of conductive element, a downward directed pin 128 is aligned to insert into an opening of a printed circuit board. FIG. 12B depicts conductive element 96 interfaced with intermediate switch member 94, which in turn inserts into spring fingers 116 of conductive member 110. The flat bottom surface of conductive element 96 provides a pad for placement on a printed circuit board pad, such as with solder paste. A pin or pad coupling point may be used for either conductive element 90 or 96.

Figure 13:
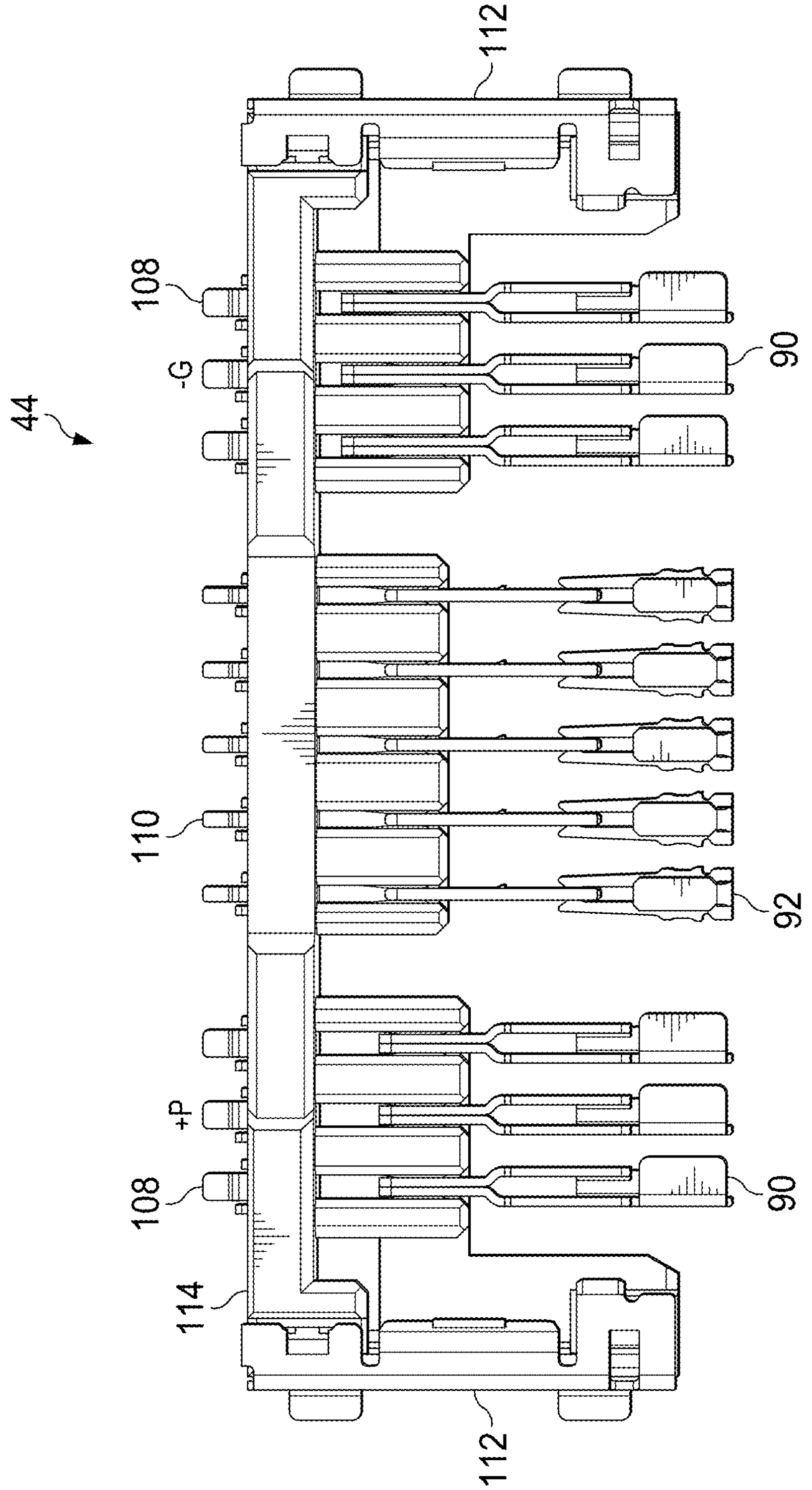
FIG. 13 depicts a top view of the battery receptacle showing an alternative embodiment having longer ground battery connector conductive elements.

Referring now to FIG. 13, an top view of the battery receptacle 44 shows an alternative embodiment having longer ground battery connector conductive elements. In the example embodiment, endpieces 112 couple battery receptacle 44 to a motherboard with conductive members 108 and 110 receiving conductive elements 90 and 92 of the battery connector. Conductive elements 90 have a longer length on the ground side of the battery receptacle than on the positive terminal side of the battery receptacle. The greater length of the ground conductive elements result in ground making electrical contact with the battery receptacle before the positive terminals. In the example embodiment, all three ground conductive elements 90 have a greater length to extend out further from the battery connector than the positive terminal conductive elements. In an alternative embodiment only one of the ground conductive elements may use the longer length so that ground is interfaced before the positive terminal while five of the conductive elements have the same SKU, thus reducing the number of different components used for production.

Figure 14:
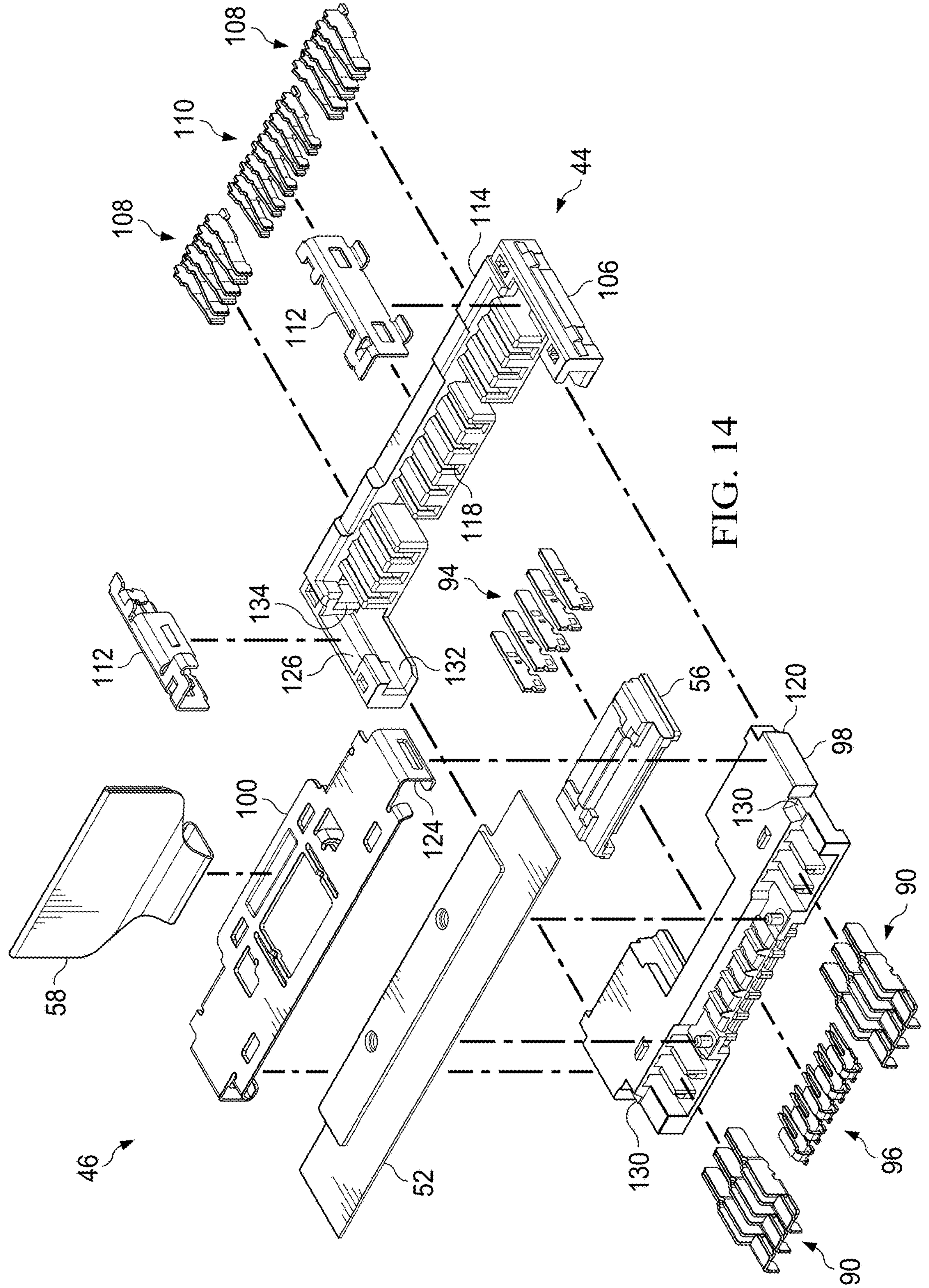
FIG. 14 depicts an example embodiment of a battery connector configured to insert into a battery receptacle that senses vertical and horizontal insertion.

Referring now to FIG. 14, an example embodiment depicts a battery connector 46 configured to insert into a battery receptacle 44 that senses vertical and horizontal insertion. In the example embodiment, an insertion tab 58 couples to the conductive cover 100 to aid in vertical insertion and removal. Nonconductive frame 98 holds conductive elements 90 and 96 in alignment with conductive members 108 and 110 of battery receptacle 44. A switch 56 selectively connects communication interfaces through conductive switch members 94. A flexible printed circuit board 52 solders to the upper flat surfaces of conductive elements 90 and 96 to interface with a battery. Nonconductive frame 114 couples to a motherboard with conductive endpieces 112, which include a vertical sensor 134 and a horizontal sensor 132 to detect vertical and horizontal insertion of a battery connector. The sensors communicate with an embedded controller through surface mount conductive region when a contact 130 contacts or comes in proximity of the sensor. In various embodiments, various types of sensors may be used include contacts, ground sensing, a switch, a Hall sensor or other types of sensors. In one example embodiment, vertical versus horizontal insertion is determined based upon which of sensors 132 or 134 first detect the battery connector presence.

Figure 15A:
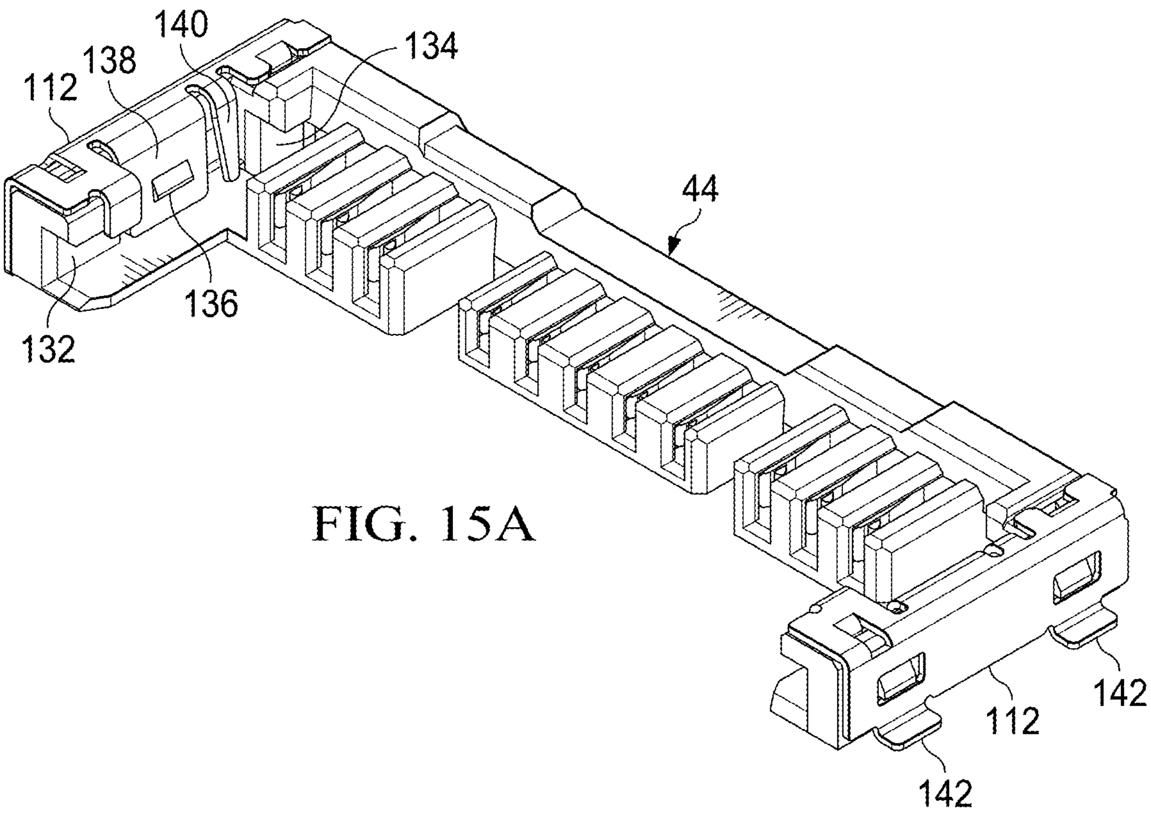
FIGS. 15A and 15B depict an example embodiment of a battery receptacle mount that includes a sensor to detect battery connector insertion.
Figure 15B:
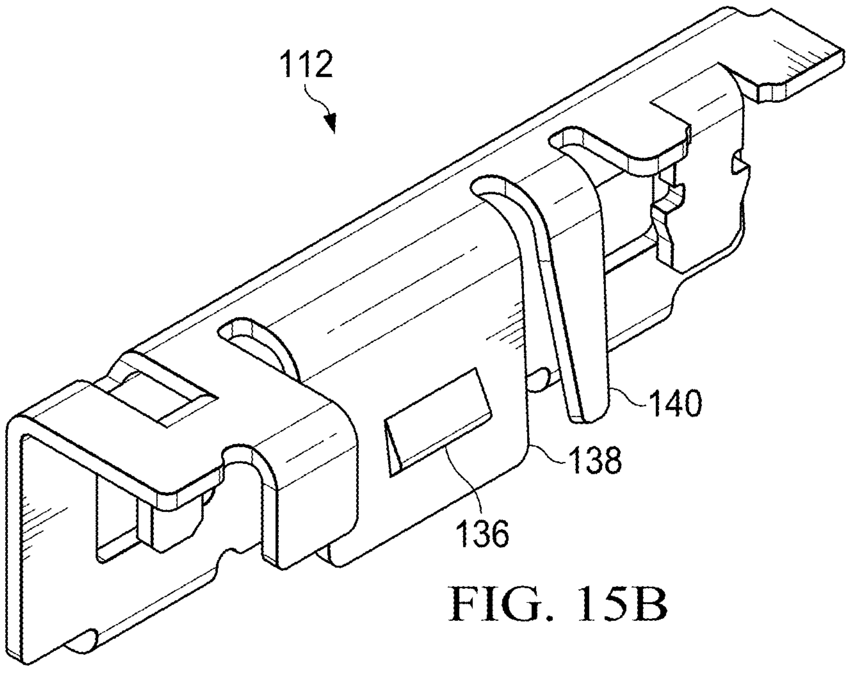

Referring now to FIGS. 15A and 15B, an example embodiment depicts a battery receptacle endpiece that includes a sensor to detect battery connector insertion. In the example embodiment, a circuit is completed through conductive material of endpieces 112 and the battery connector conductive cover when the battery connector inserts into battery receptacle 44 to make contact with sensor 132 or 134. Contacts 142 mount each endpiece 112 to the motherboard and interface through a wireline with the embedded controller, such as to a GPIO (general purpose input output). FIG. 15B depicts endpiece 112 a conductive region 136 on a resilient spring member 138 to detect vertical insertion of a battery connector and to engage. Another resilient spring member 140 engages with the battery connector to hold the battery connector in position as described below.

Figure 16:
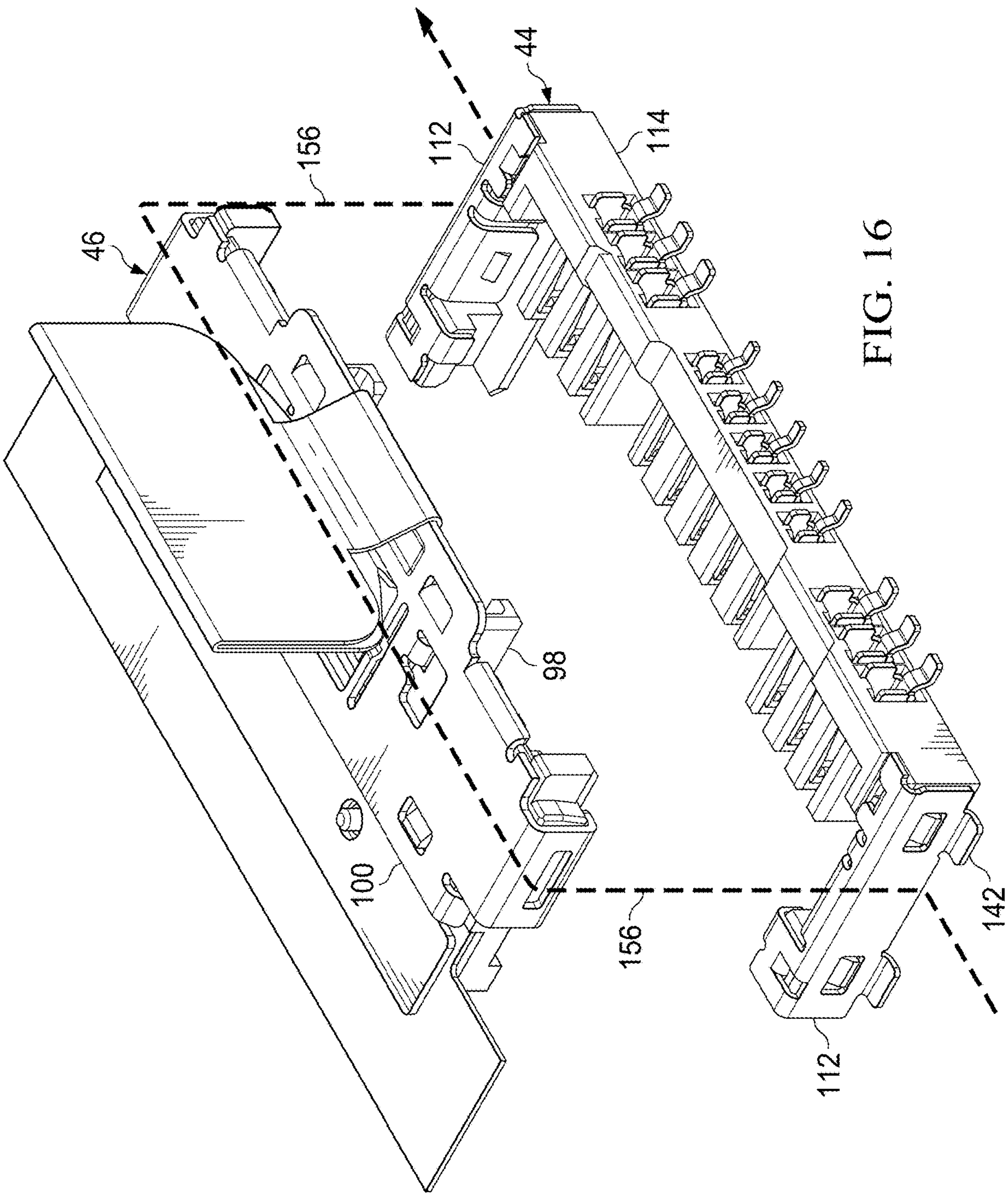
FIG. 16 depicts an example embodiment of a battery connector completing a detection circuit on insertion into a battery receptacle.

Referring now to FIG. 16, an example embodiment depicts a battery connector completing a detection circuit on insertion into a battery receptacle. In the example embodiment, a detection circuit 156 is completed from the endpiece 112 contact mount 42 through the conductive cover 100 coupled over nonconductive frame 98 to the opposing endpiece and mount. The embedded controller may react to a sensed change in battery connector state when the detection circuit is complete by performing a hard system resets, such as with a system BIOS Battery Auto Flash feature stored in non-transitory memory. The system reset ensures that a hung processor, BIOS or operating system will be hard reset at a change in battery state, such as by a battery insertion or removal, which the power switch may not accomplish on the battery connector when the cutting off of communication is not detected at a hung system.

Figure 17B:
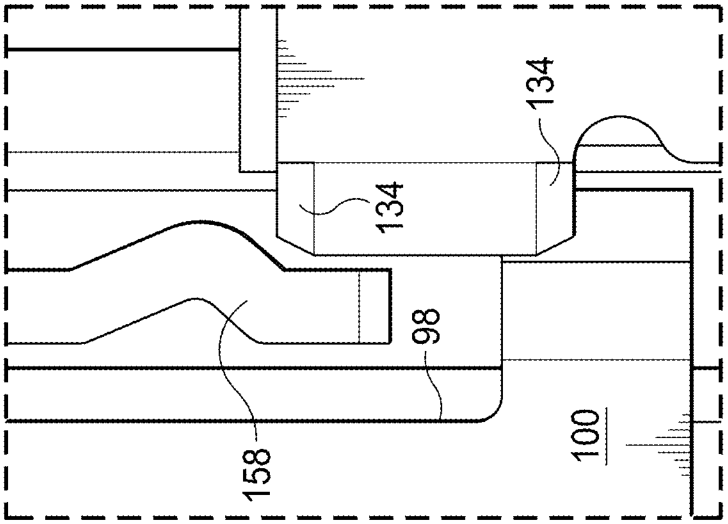
FIGS. 17A and 17B depict an example embodiment of the detection circuit detecting a horizonal insertion of the battery connector without triggering a vertical insertion detection circuit.
Figure 17A:
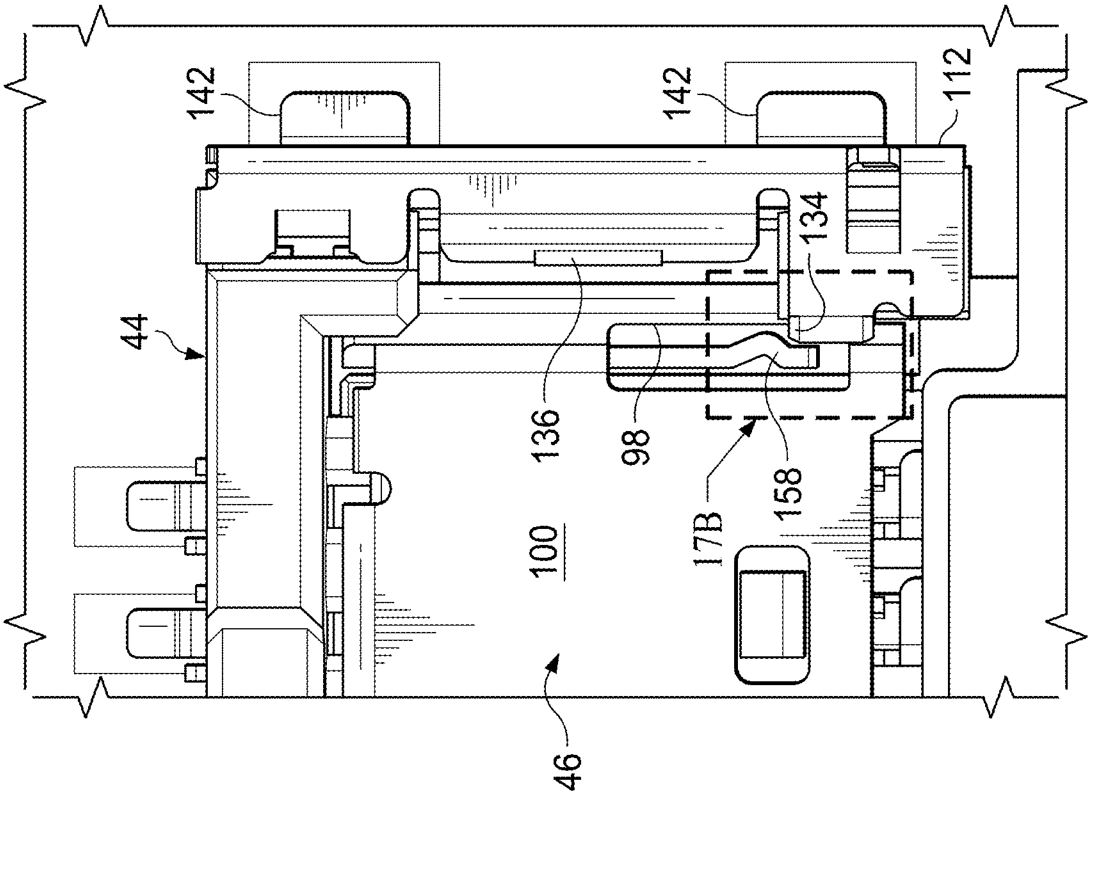

Referring now to FIGS. 17A and 17B, an example embodiment depicts the detection circuit detecting a horizonal insertion of the battery connector without triggering a vertical insertion detection circuit. In the example embodiment, battery connector 46 slides horizontally into battery receptacle 44 to engage a spring member 158 against endpiece 112 and completing a circuit at sensor 134 through a first of the endpiece mounts 142. The insertion of battery connector 46 horizontally does not result in a contact at sensor 134, which interfaces to the embedded controller through a second of the mounts 142. The embedded controller detects the completion of the detection circuit and determines a horizontal insertion based upon the closed circuit for the first mount 142 and open circuit for the second mount 142 established across the conductive cover 100.

Figure 18B:
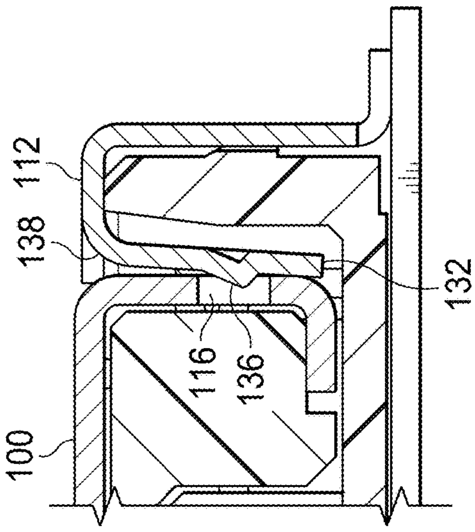
FIGS. 18A, 18B and 18C depict an example embodiment of the detection circuit detecting a vertical insertion of the battery connector without triggering a horizontal insertion detection circuit.
Figure 18C:
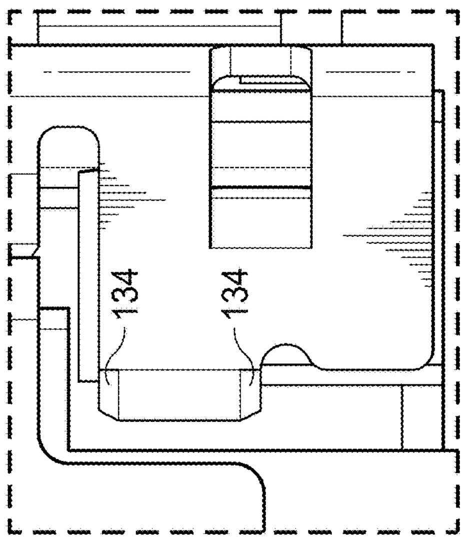
Figure 18A:
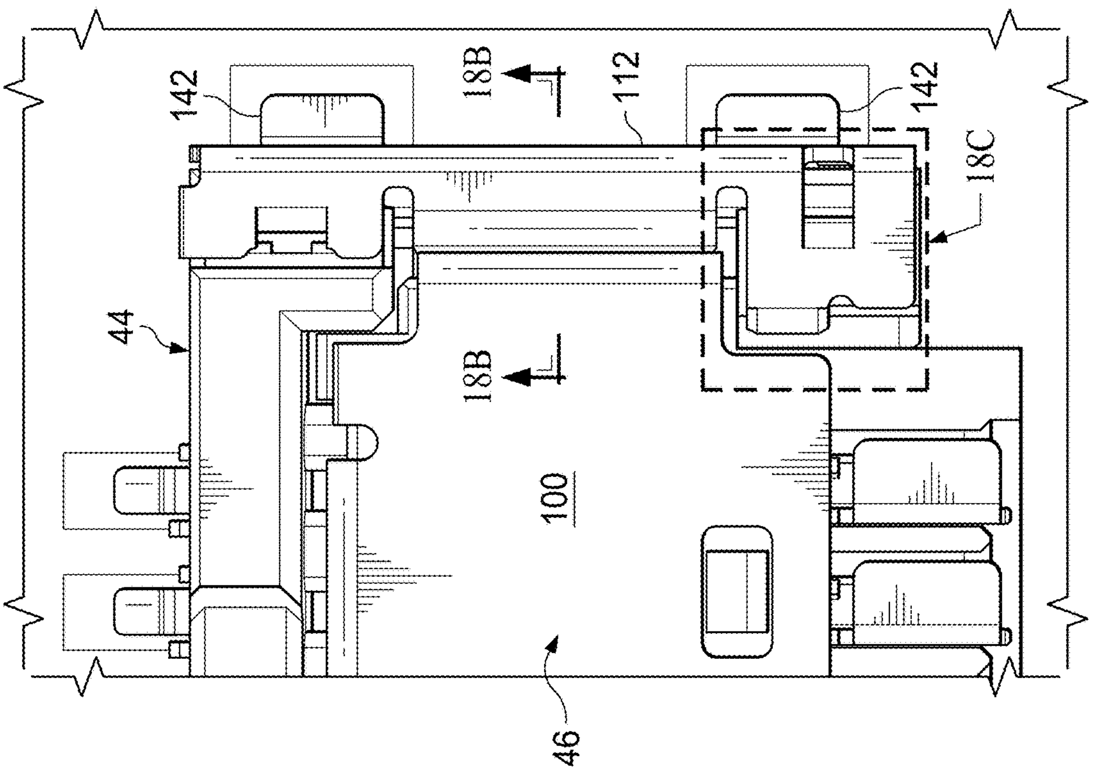
Figure 19A:
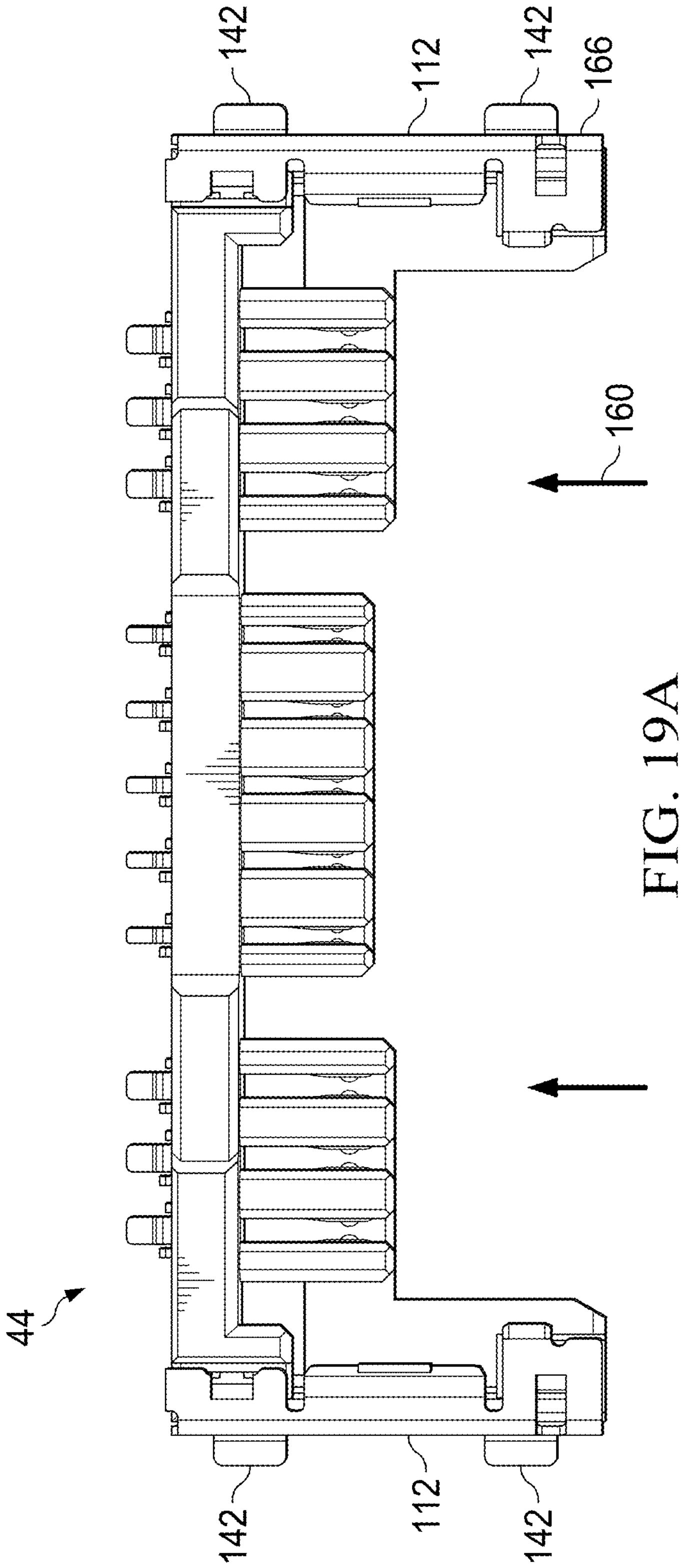
FIGS. 19A, 19B, 19C and 19D depict an alternative embodiment of a horizontal insertion arrangement of a battery connector and battery receptacle.
Figure 19B:
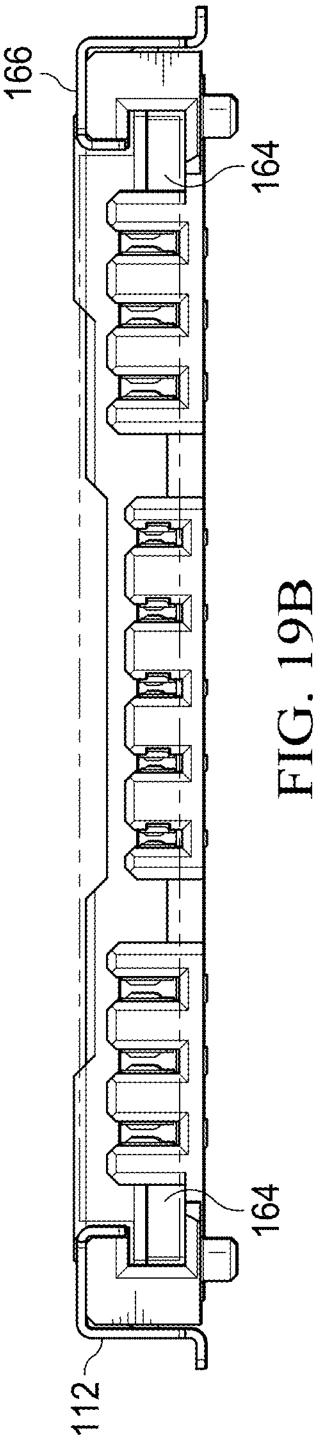
Figure 19C:
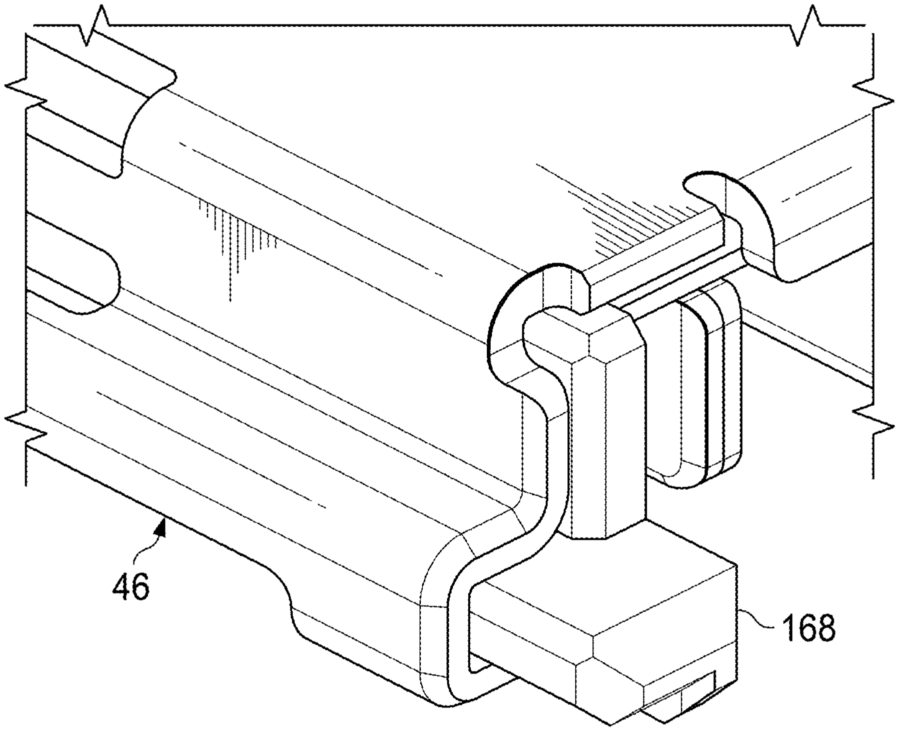
Figure 19D:
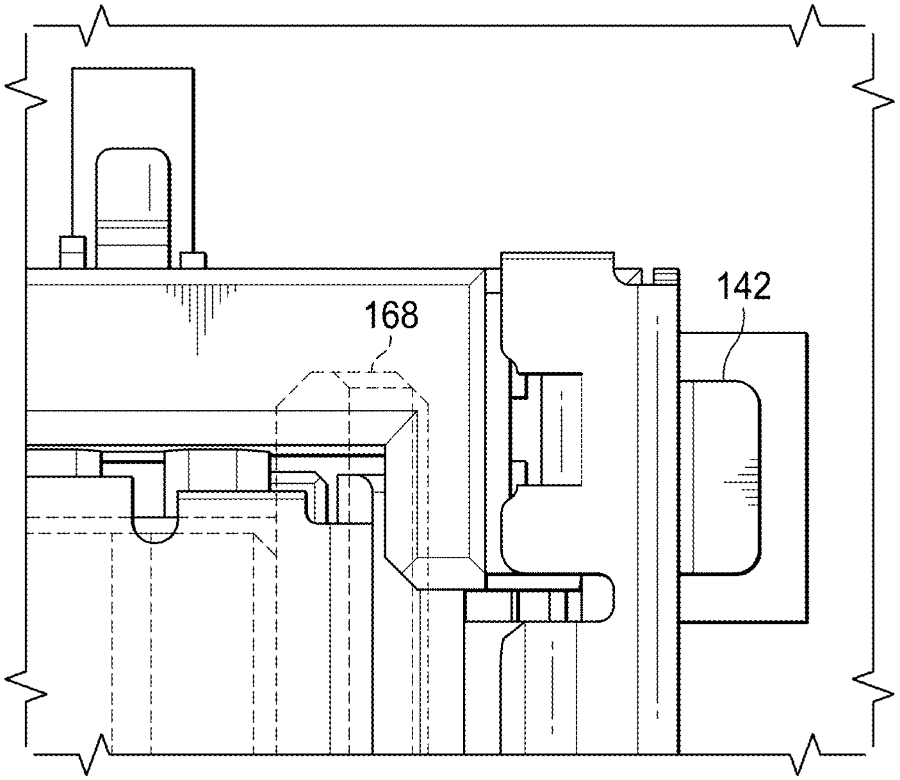

Referring now to FIGS. 18A, 18B and 18B, an example embodiment depicts the detection circuit detecting a vertical insertion of the battery connector without triggering a horizontal insertion detection circuit. In the example embodiment, vertical insertion of battery connector 46 into battery receptacle 44 establishes a coupling with resilient member 138 that bring contact of sensor 134 in a slot of conductive cover 100 so that the detection circuit is complete through the mount 142 that indicates a vertical insertion. FIG. 18C depicts that the horizontal insertion sensor 134 does not make contact so that the embedded controller can determine the type of connector insertion.

Referring now to FIGS. 19A, 19B, 19C and 19D, an alternative embodiment of a horizontal insertion arrangement of a battery connector and battery receptacle is depicted. Battery receptacle 44 has a guide 164 that a rail 168 of battery connector 46 fits into to slide to an engaged position as indicated by arrows 160. FIG. 20D depicts an example of the battery connector 46 fully inserted into battery receptacle 44 with an extended length ground connector 168 that contacts battery receptacle 44 before any positive terminals.

Figure 20A:
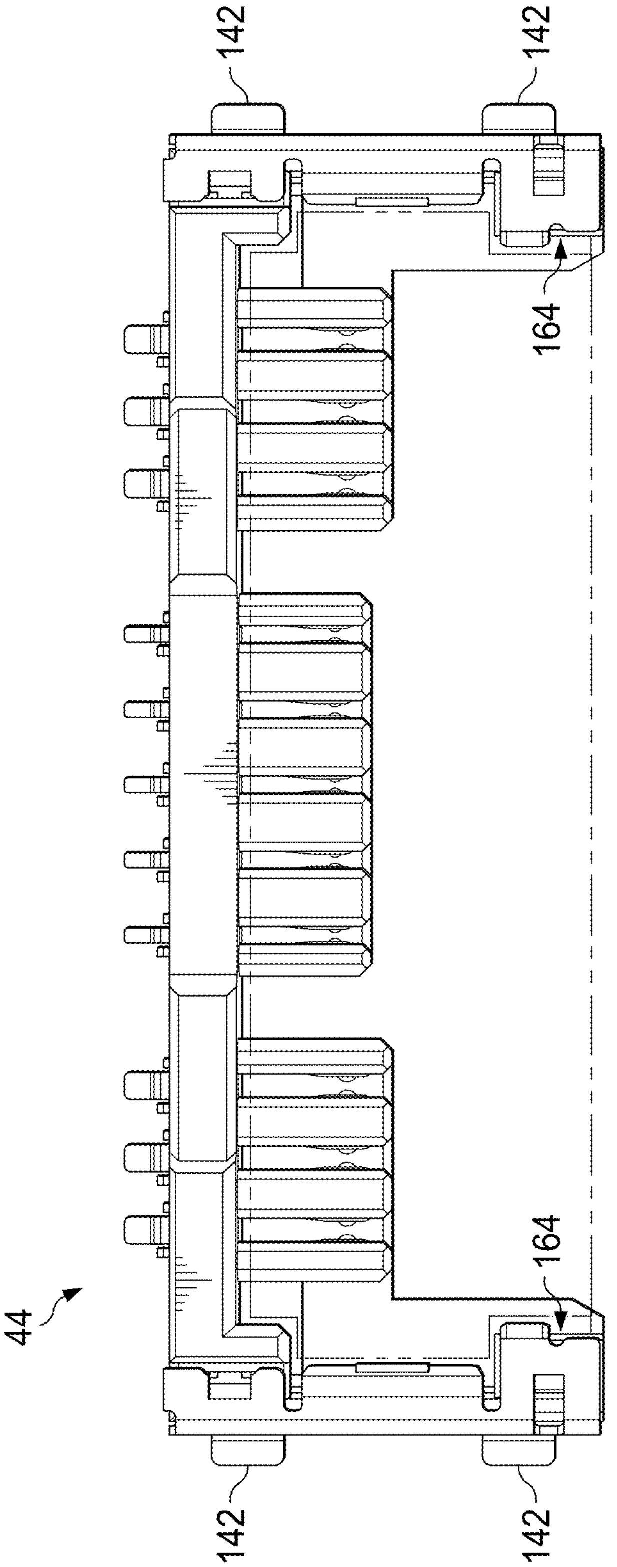
FIGS. 20A and 20B depict an alternative embodiment of a vertical insertion arrangement of a battery connector and battery receptacle.
Figure 20B:
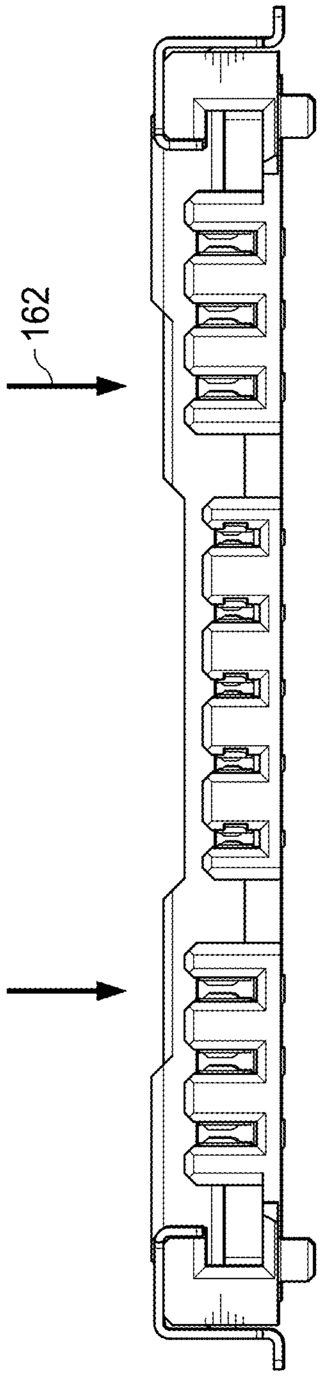

Referring now to FIGS. 20A and 20B, an alternative embodiment of a vertical insertion arrangement of a battery connector and battery receptacle is depicted. As indicated by arrows 162 the battery connector presses down vertically into battery receptacle 44 so that the same battery receptacle supports multiple types of battery connectors.

Figure 21A:
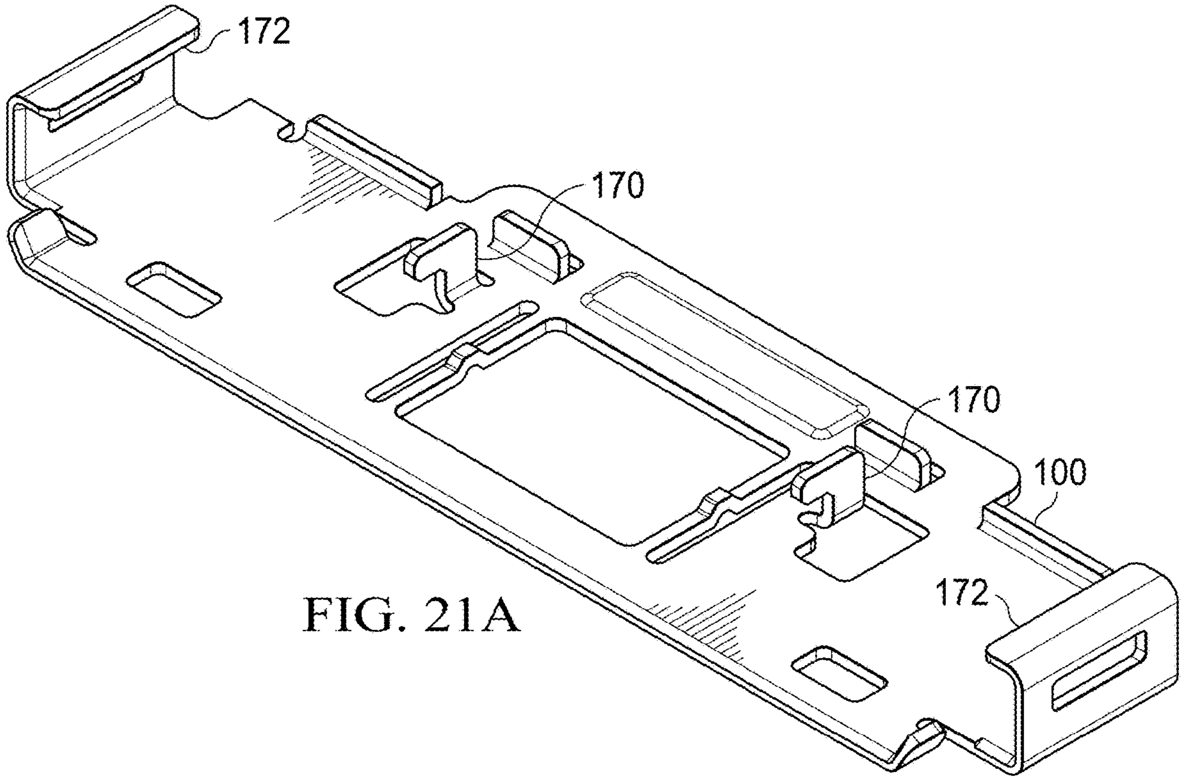
FIGS. 21A and 21B depict an example embodiment of a conductive cover of the battery connector bottom and sectional views.
Figure 21B:
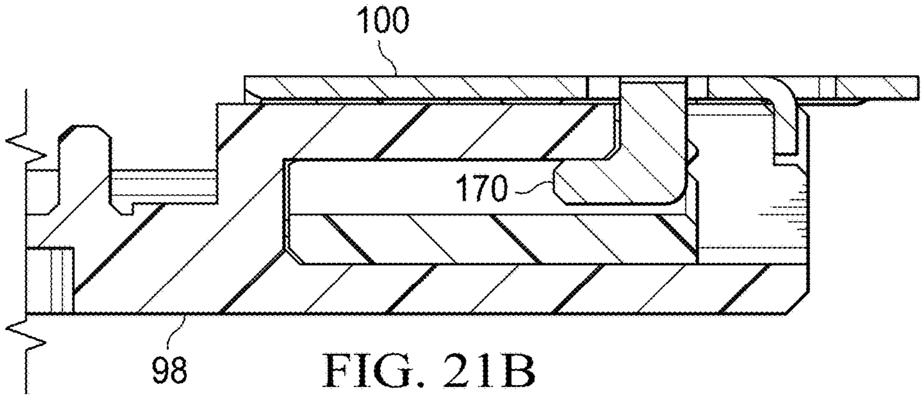

Referring now to FIGS. 21A and 21B, an example embodiment depicts a conductive cover of the battery connector bottom and sectional views. The bottom view of FIG. 21A illustrates an example of hooks 170 that extend down into the battery connector nonconductive frame 98. Lips 172 formed by bending the edges of conductive cover 100 grab the nonconductive frame at opposing sides to form a guide that fits into a slot of the battery receptacle during vertical press down insertion.

Figure 22:
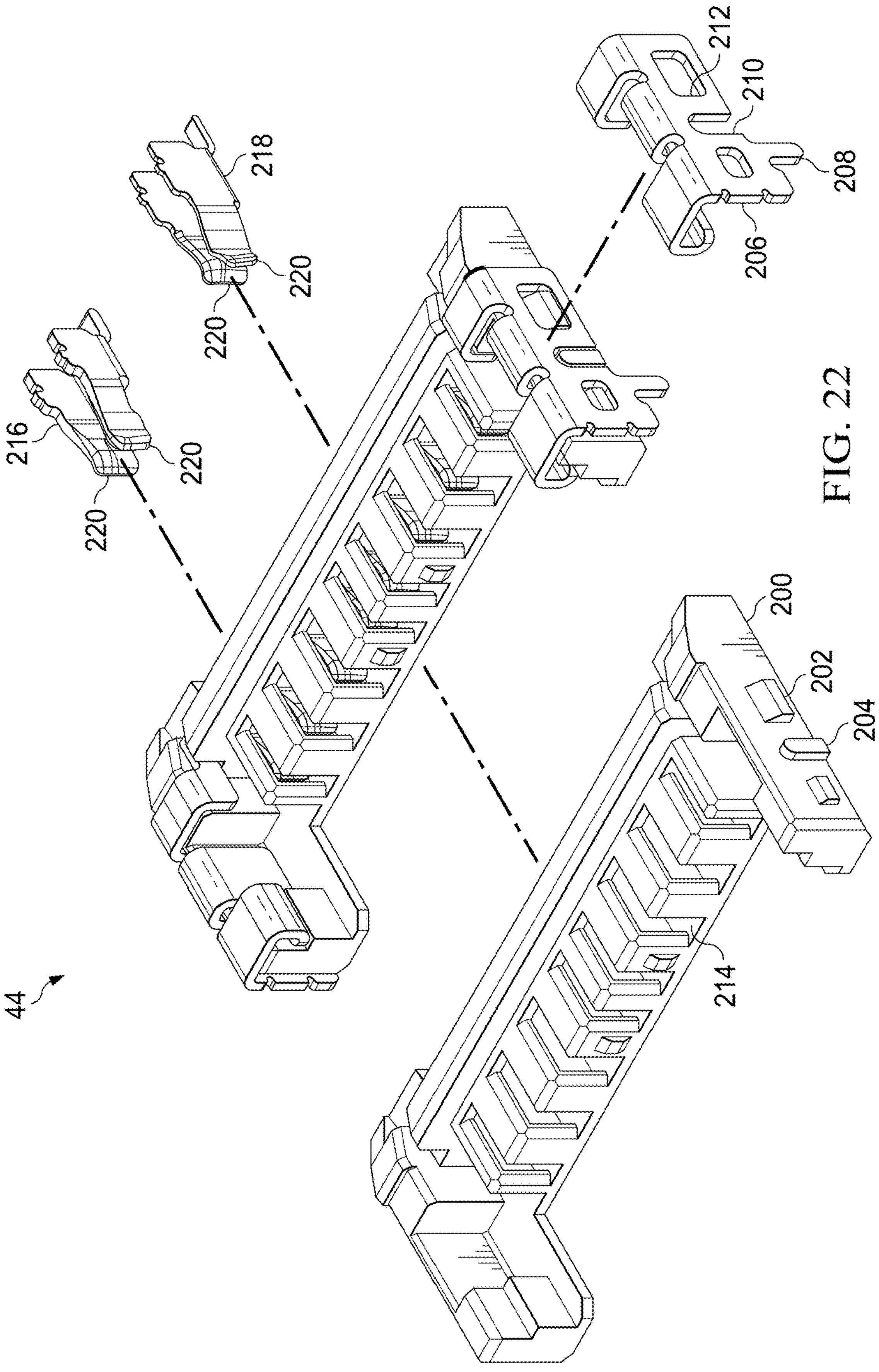
FIG. 22 depicts an exploded perspective view depicts an alternative embodiment of a battery receptacle having a reduced size.

Referring now to FIG. 22, an exploded perspective view depicts an alternative embodiment of a battery receptacle 44 having a reduced size. In the example embodiment, a nonconductive frame 200 has slots 214 populated by power conductive members 216 and communications conductive members 218 that each have spring fingers 220 to couple with connector conductive elements. An endpiece 206 couples to each opposing end of nonconductive frame 200 with a circuit board insertion pin 208. The endpiece has a slot 210 that aligns with a post 204 and a post 202 that locks into an opening 212. Power and communication conductive members may be in various of the slots 214.

Figure 23A:
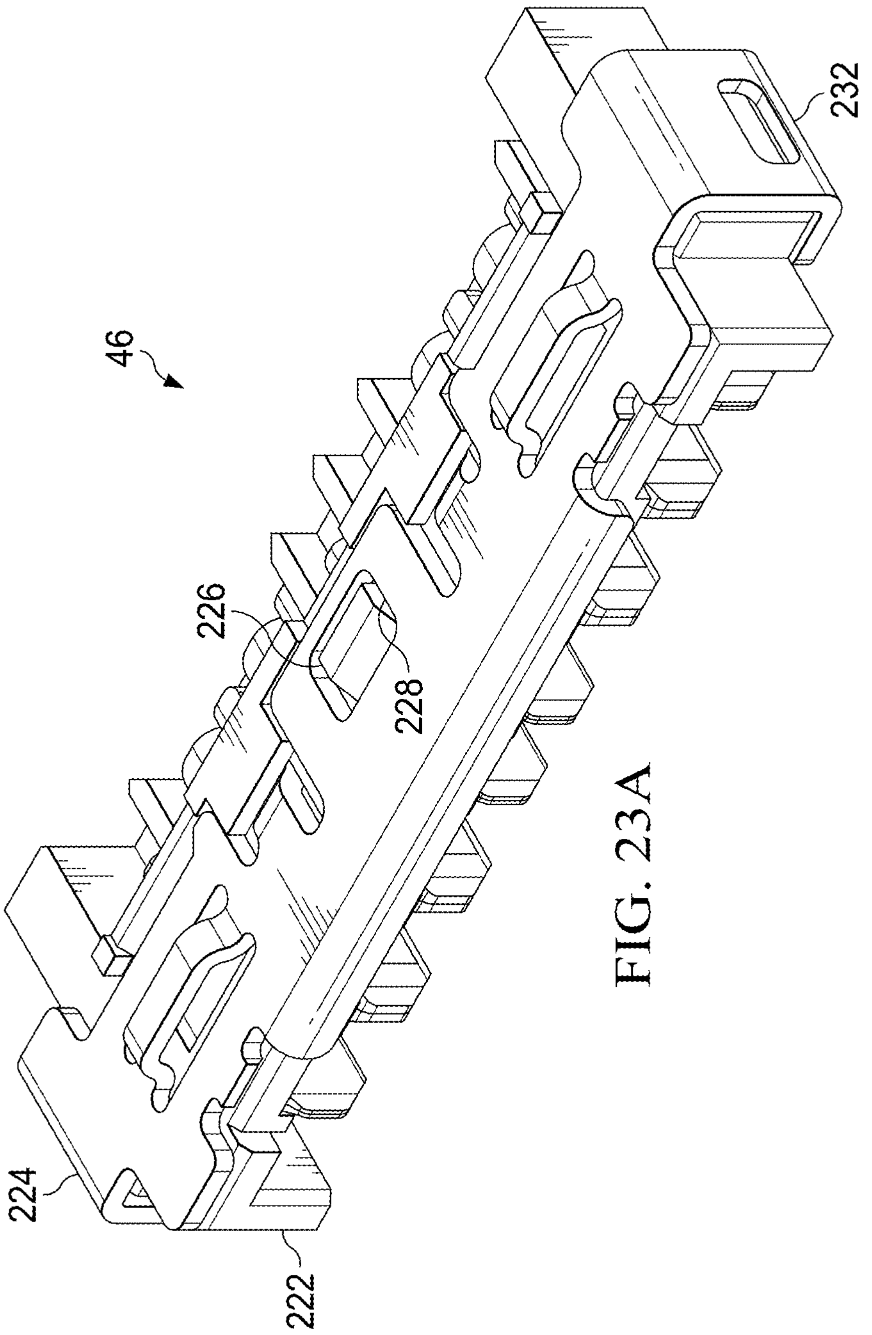
FIGS. 23A and 23B depict an example embodiment of a battery connector for vertical press down installation in a reduced footprint.
Figure 23B:
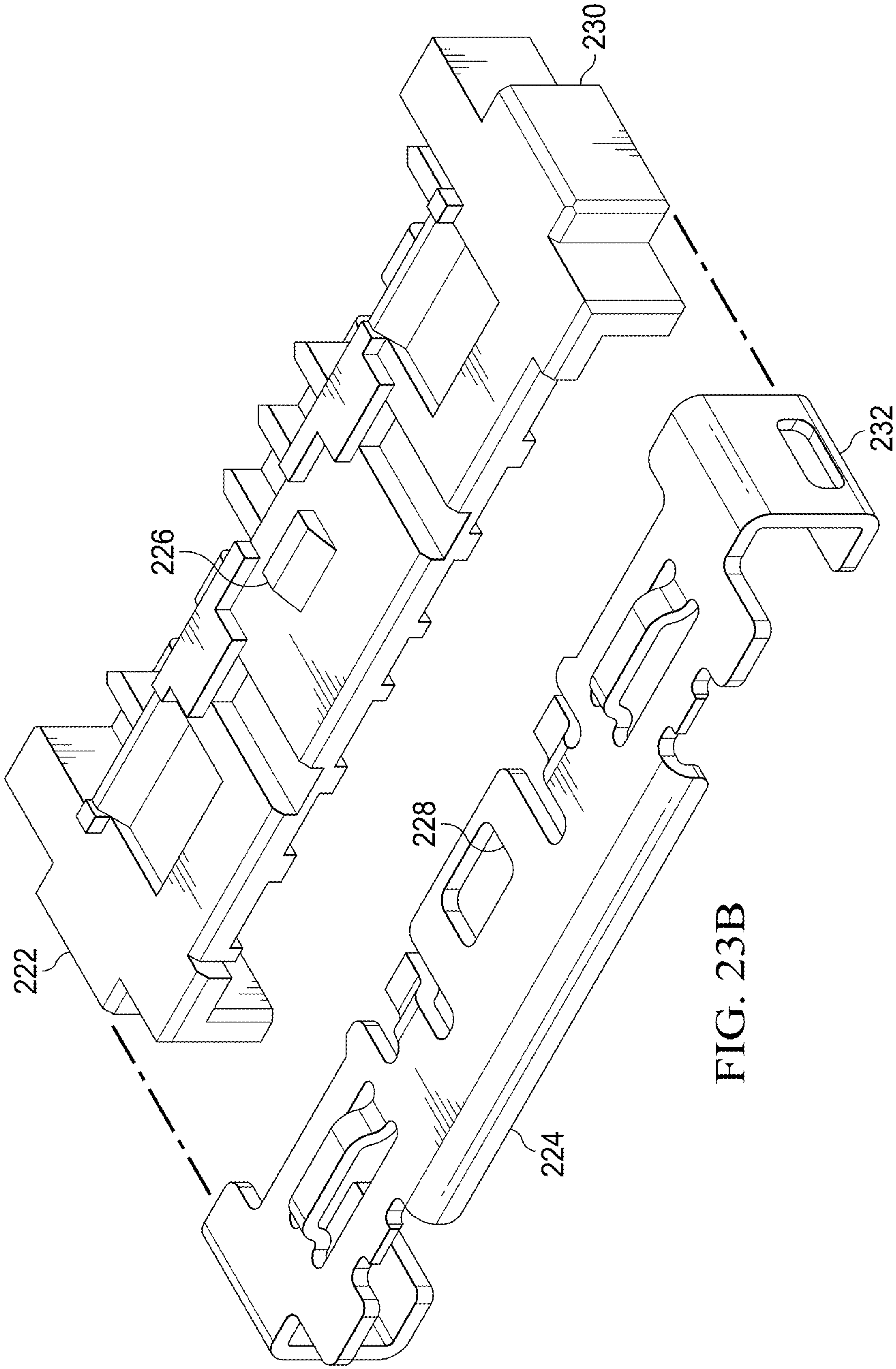

Referring now to FIGS. 23A and 23B, an example embodiment depicts a battery connector 46 for vertical press down installation in a reduced footprint. A conductive cover 222 couples over a nonconductive frame 222 with alignment by a tab 226 that inserts in an opening 228. An end extension 232 couples over an end 230 of the frame to define a guidepost that aligns the connector for a vertical press down insertion.

Figure 24A:
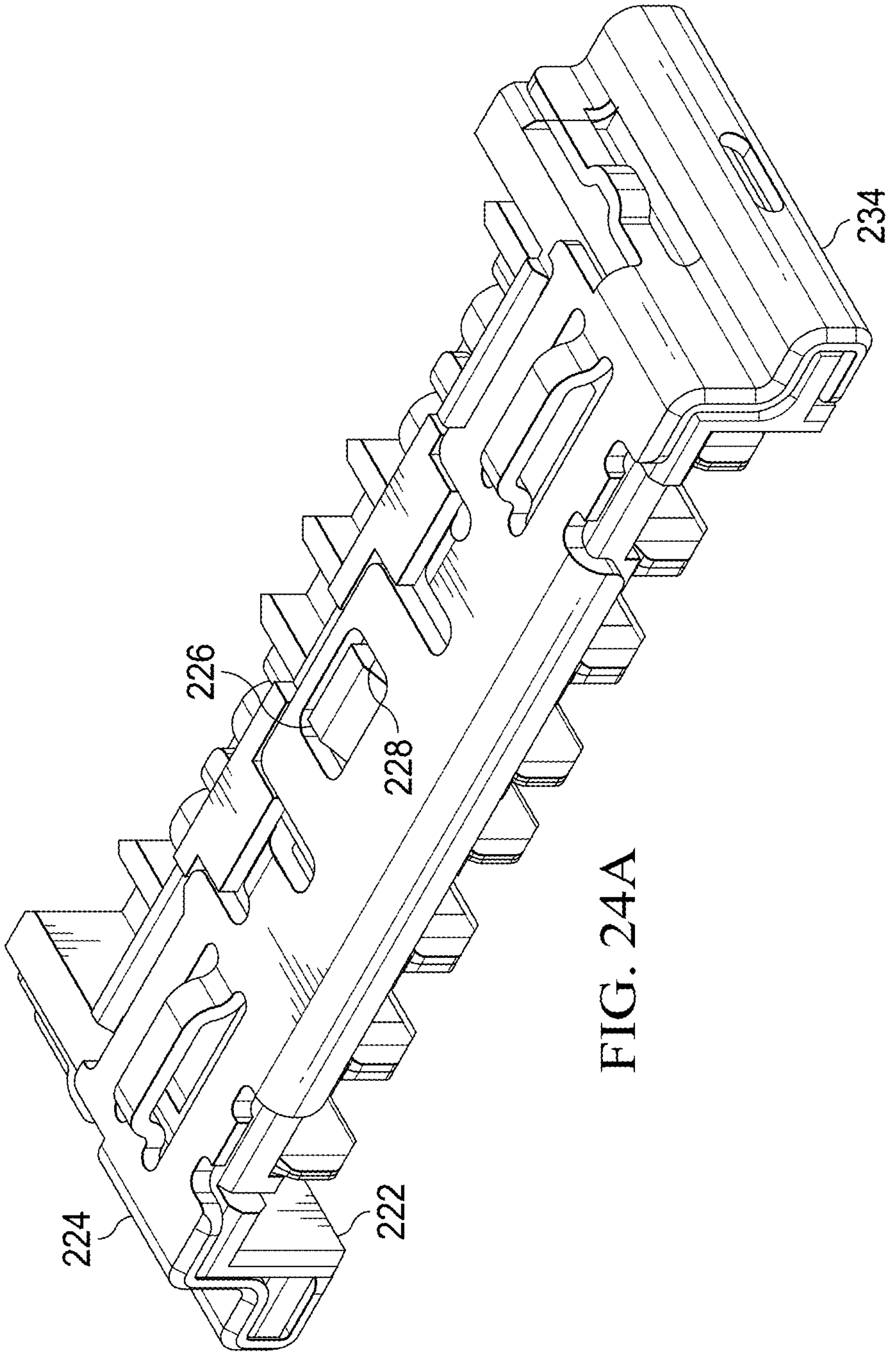
FIGS. 24A and 24B depict an example embodiment of a battery connector for horizontal sliding installation in a reduced footprint.
Figure 24B:
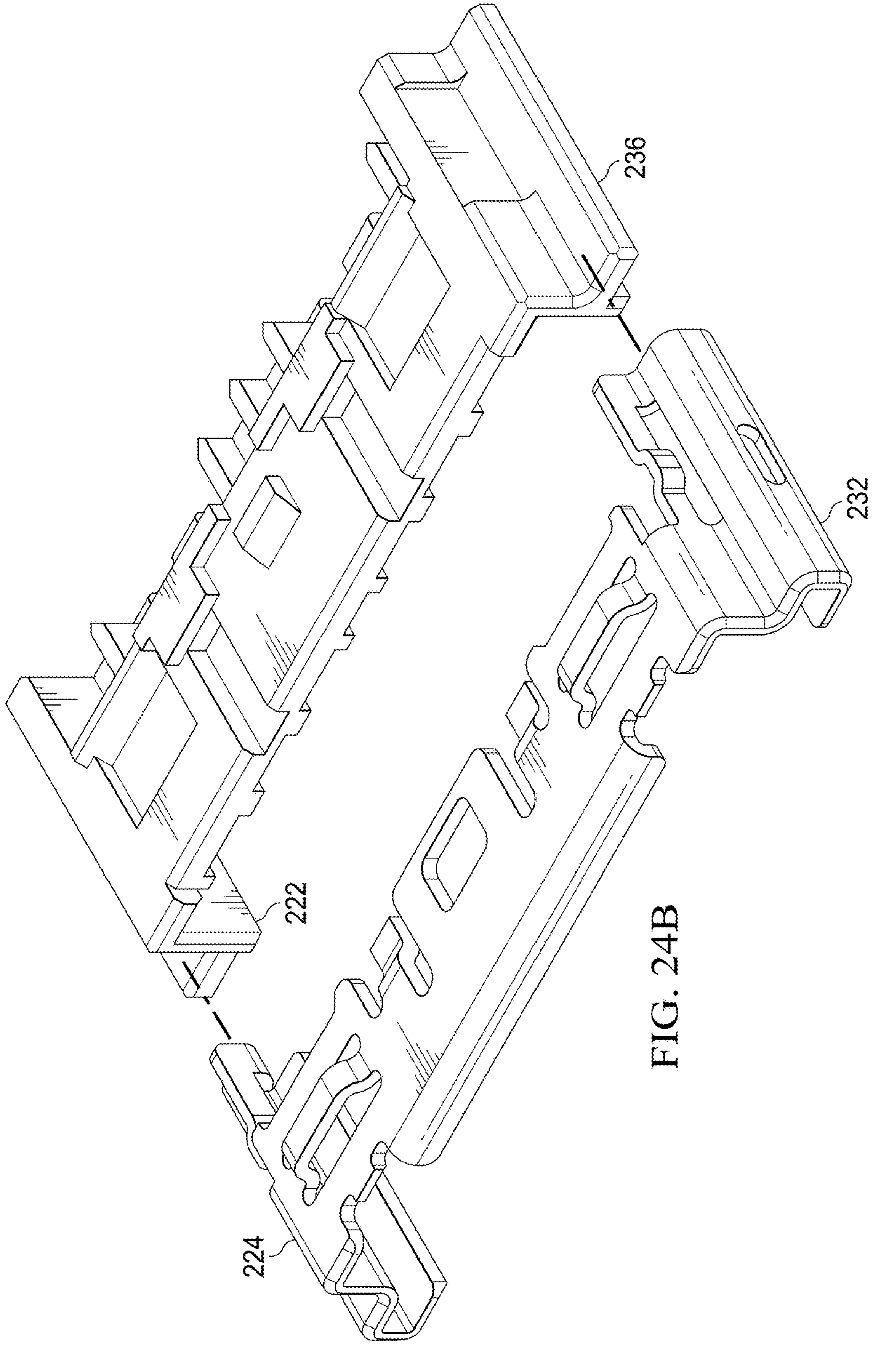

Referring now to FIGS. 24A and 24B, an example embodiment depicts a battery connector 46 for horizontal sliding installation in a reduced footprint. In the example embodiment, a nonconductive frame 222 has a rail 236 on each opposing end that accepts a guide 232 of a conductive cover 224. The assembly slides into a battery receptacle with conductive guide 232 inserting into the receptacle.

Figure 25:
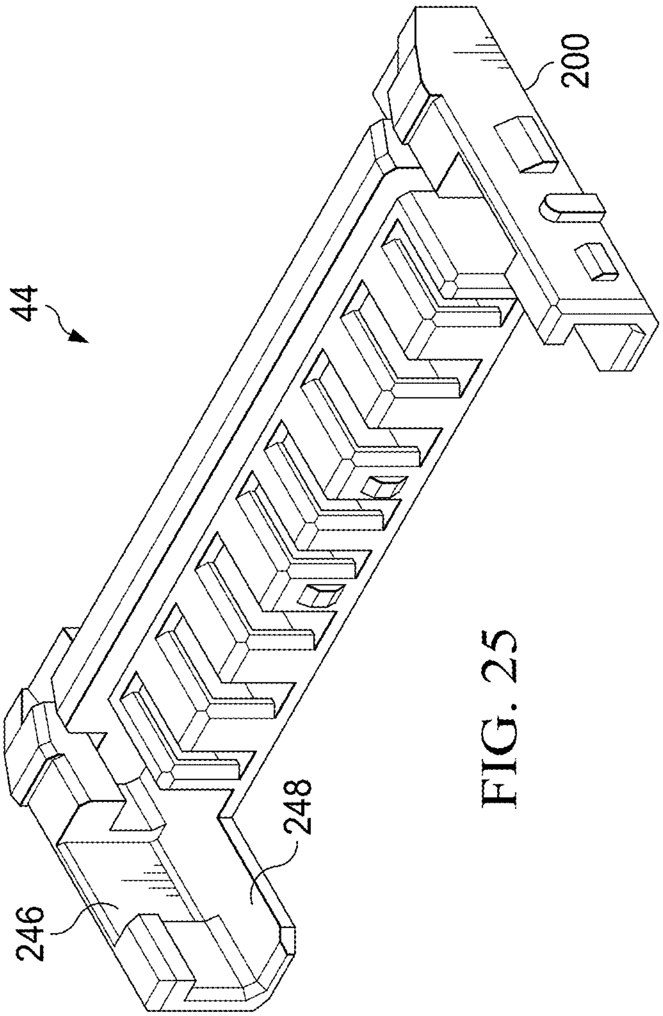
FIG. 25 depicts an example of a battery receptacle that accepts both vertical press down and horizontal sliding insertion.

Referring now to FIG. 25, an example depicts a battery receptacle 44 that accepts both vertical press down and horizontal sliding insertion. Nonconductive frame 200 has a post guide 246 to accept a vertical press down battery connector and a sliding guide 248 to accept a horizontal sliding battery connector. In the example embodiment, the battery receptacle uses the same components to adapt to different types of battery connectors. The battery connectors shown in FIGS. 23 and 24 each have a different formats to fit into the same receptacle. In various embodiments, the components of the battery connectors and battery receptacles are interchangeable so that manufacture is supported across multiple platforms.

Figure 26:
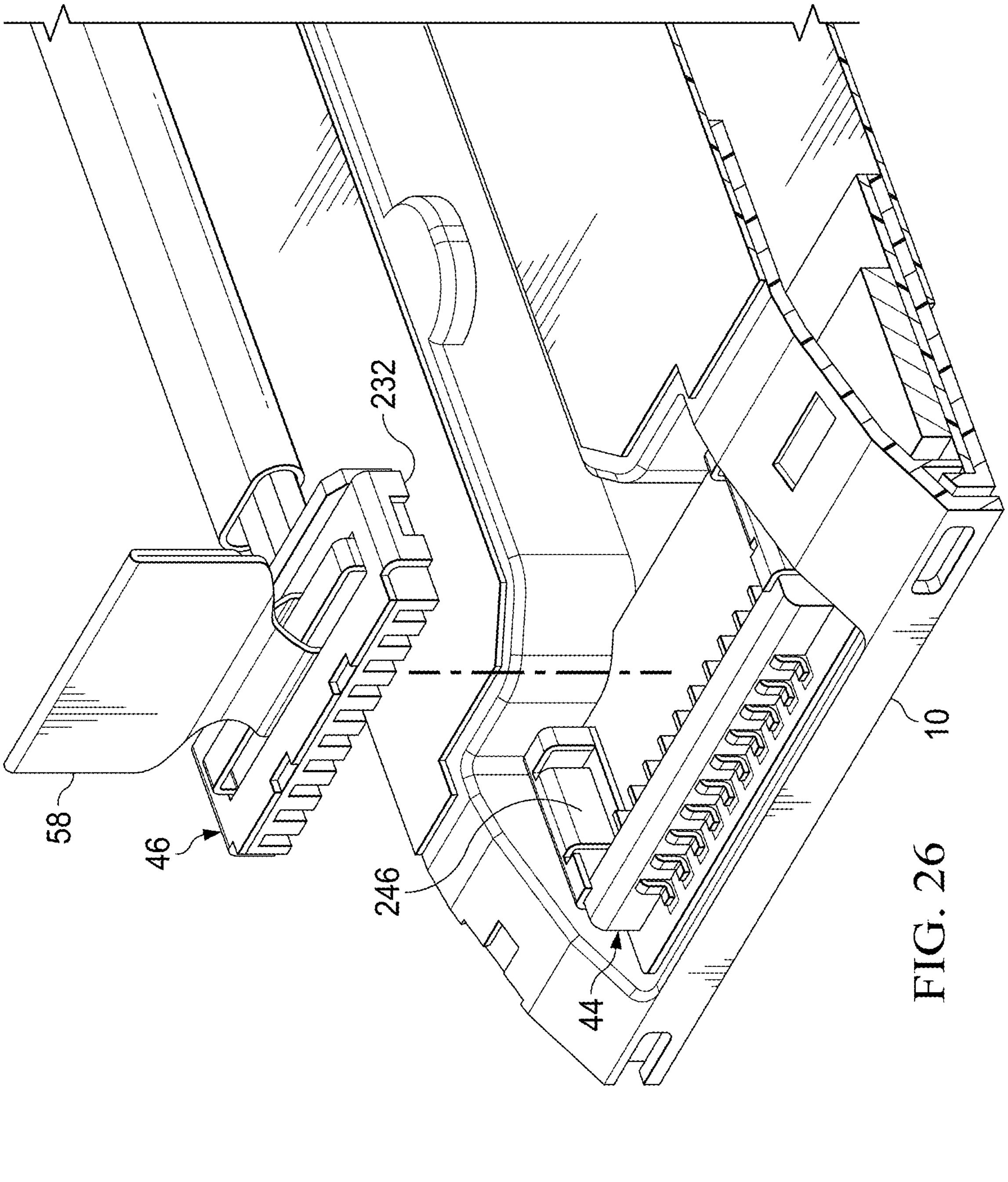
FIG. 26 depicts a low profile battery connector couples to an information handling system battery receptacle.

Referring now to FIG. 26, a low profile battery connector 46 couples to an information handling system 10 battery receptacle 44. In the example embodiment, battery receptacle 44 has a vertical insert post guide 246 that accepts battery connector 46 post guide 232. A tab 58 is exposed at the battery connector upper surface to aid in placement and removal of battery connector 46. Although the example embodiment shows a vertical press down insertion of the battery connector, in alternative embodiments a swap of the battery receptacle endpieces and battery connector can adapt the interface to a sliding type of connection. The battery connector interfaces with a cable having individual wire line connections, however a flexible printed circuit board may be used instead without changing the battery connector conductive elements.

Although the present invention has been described in detail, it should be understood that various changes, substitutions and alterations can be made hereto without departing from the spirit and scope of the invention as defined by the appended claims.

What is claimed is:

1. An information handling system comprising:
- a motherboard;
- a processor coupled to the motherboard and operable to execute instructions that process information;
- a memory coupled to the motherboard and interfaced with the processor, the memory operable to store the instructions and information;
- a battery configured to store power;
- a battery connector interfaced with the battery and having plural conductive elements; and
- a battery receptacle coupled to the motherboard and having plural exposed conductive members aligned to interface with the battery connector plural conductive elements, the battery receptacle having a frame having plural slots, each slot holding a conductive member, an endpiece coupled to each of opposing ends of the frame, a horizontal guide to accept the battery connector slid horizontally to contact the conductive elements and the conductive members, and a horizontal spring member to engage the battery connector when slid horizontally to an engagement position.

2. The information handling system of claim 1 wherein the battery receptacle conductive members each further comprise:
- a contact at one end coupled to the motherboard at a surface mount conductive region of the motherboard; and
- spring arms at an opposite end of the board contact, the spring arms accepting a battery connector conductive element inserted horizontally and vertically to clip within the spring arms.

3. The information handling system of claim 1 wherein the battery receptacle comprises a first set of ground conductive members at a first side, a second set of positive conductive members at a second side, and plural communication conductive members between the ground conductive elements and the positive conductive elements.

4. The information handling system of claim 3 wherein one of the communication members is a power supply for a real time clock coupled to the motherboard.

5. The information handling system of claim 1 wherein the endpiece further comprises:
- a vertical guide to accept the battery connector pressed vertically to contact the conductive elements and the conductive members; and
- a vertical spring member to engage the battery connector when pressed vertically to an engagement position.

6. The information handling system of claim 1 wherein the battery connector couples only to the horizontal spring member when slid horizontally into position and couples only to the vertical spring member when pressed vertically into position.

7. The information handling system of claim 6 further comprising:
- first and second vertical contacts to detect when the battery connector interfaces vertically; and
- first and second horizonal contacts to detect when the battery connector interfaces horizontally.

8. A battery connector system to power an information handling system, the system comprising:
- a battery configured to store power;
- a battery connector interfaced with the battery and having plural conductive elements; and
- a battery receptacle coupled to a motherboard and having plural exposed conductive members aligned to interface with the battery connector plural conductive elements, the battery receptacle having a frame having plural slots, each slot holding a conductive member, and an endpiece coupled to each of opposing ends of the frame, the endpiece having a horizontal guide to accept the battery connector slide horizontally to contact the conductive members and a vertical guide to accept the battery connector pressed vertically to contact the conductive elements and the conductive members.

9. The system of claim 8 wherein the battery receptacle conductive members each further comprise:
- a board contact at one end coupled to the motherboard; and
- spring arms at an opposite end of the board contact, the spring arms accepting a battery connector conductive element inserted horizontally and vertically to clip within the spring arms.

10. The system of claim 9 wherein the endpiece further comprises:
- a horizontal spring member to engage the battery connector when slid horizontally to an engagement position;

and
- a vertical spring member to engage the battery connector when pressed vertically to an engagement position.

* * * * *